United States Patent
Ochiai et al.

(10) Patent No.: US 11,849,238 B2
(45) Date of Patent: Dec. 19, 2023

(54) PHOTOELECTRIC CONVERSION APPARATUS, PHOTOELECTRIC CONVERSION SYSTEM, MOVING BODY

(71) Applicant: CANON KABUSHIKI KAISHA, Tokyo (JP)

(72) Inventors: Kei Ochiai, Tokyo (JP); Yoshiaki Takada, Kanagawa (JP); Masaki Sato, Kanagawa (JP); Masahiro Kobayashi, Tokyo (JP); Daisuke Kobayashi, Saitama (JP); Tetsuya Itano, Kanagawa (JP); Nao Nakatsuji, Kanagawa (JP); Yasuhiro Oguro, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/591,496

(22) Filed: Feb. 2, 2022

(65) Prior Publication Data
US 2022/0247966 A1    Aug. 4, 2022

(30) Foreign Application Priority Data
Feb. 4, 2021 (JP) .................... 2021-016446

(51) Int. Cl.
*H04N 25/772* (2023.01)
*H04N 25/50* (2023.01)
(Continued)

(52) U.S. Cl.
CPC .......... *H04N 25/772* (2023.01); *H04N 25/50* (2023.01); *H04N 25/75* (2023.01); *H04N 25/79* (2023.01); *H01L 27/14634* (2013.01)

(58) Field of Classification Search
CPC ...... H04N 25/772; H04N 25/50; H04N 25/75; H04N 25/79; H04N 25/00;
(Continued)

(56) References Cited

U.S. PATENT DOCUMENTS

2019/0252421 A1* 8/2019 Yoshida ................. H04N 25/75
2020/0273901 A1* 8/2020 Nakamura ............. H01L 25/18
(Continued)

FOREIGN PATENT DOCUMENTS

EP    3525452 A1    8/2019
EP    3930303 A1    12/2021
(Continued)

OTHER PUBLICATIONS

Mukhopodhyay Saibal et al.; "The CAMEL Approach to Stacked Sensor Smart Cameras;" School of ECE, Georgia Institute of Technology, Atlanta, GA, USA.; Design, Automation and Test in Europe (Date 2018); pp. 1299-1303.
(Continued)

*Primary Examiner* — Lin Ye
*Assistant Examiner* — Chan T Nguyen
(74) *Attorney, Agent, or Firm* — CANON U.S.A., INC. IP Division

(57) ABSTRACT

A photoelectric conversion apparatus includes a first substrate including a pixel array including a plurality of pixels, a second substrate layered on the first substrate and including an AD conversion portion including a plurality of AD conversion circuits configured to convert a signal output from the first substrate into a digital signal, wherein the second substrate further includes a plurality of signal processing units including a first signal processing unit and a second signal processing unit both configured to perform machine learning processing, wherein each of a plurality of sets includes a plurality of AD conversion circuits that differ between the plurality of sets, wherein the first signal processing unit is arranged to correspond to one of the plurality of sets, and wherein the second signal processing unit is arranged to correspond to another one of the plurality of sets.

25 Claims, 21 Drawing Sheets

(51) Int. Cl.
*H04N 25/75* (2023.01)
*H04N 25/79* (2023.01)
*H01L 27/146* (2006.01)

(58) Field of Classification Search
CPC ......... H01L 27/14634; H01L 27/14609; H01L 27/14643; H01L 27/14603; H01L 27/14665; G06N 20/00
USPC ....................................................... 348/302
See application file for complete search history.

(56) References Cited

U.S. PATENT DOCUMENTS

| | | |
|---|---|---|
| 2020/0412982 A1 | 12/2020 | Haneda |
| 2021/0166117 A1* | 6/2021 | Chu ........................ G06N 3/04 |
| 2021/0168318 A1* | 6/2021 | Eki ........................ H04N 25/75 |
| 2021/0227168 A1* | 7/2021 | Inada ..................... H04N 25/60 |

FOREIGN PATENT DOCUMENTS

| | | |
|---|---|---|
| JP | 2002-165126 A | 6/2002 |
| JP | 2015-216334 A | 12/2015 |
| JP | 2018-182038 A | 11/2018 |
| JP | 2019080199 A | 5/2019 |
| JP | 2020-025263 A | 2/2020 |
| JP | 2020025263 A | 2/2020 |
| JP | 2020025264 A | 2/2020 |
| JP | 2021005846 A | 1/2021 |
| WO | 2019065393 A1 | 4/2019 |
| WO | 2020027161 A1 | 2/2020 |
| WO | 2020027230 A1 | 2/2020 |
| WO | 2020/170890 A1 | 8/2020 |
| WO | 2021/161712 A1 | 8/2021 |

OTHER PUBLICATIONS

Tuan Duong, et al.; "Lower Power Analog Neurosynapse Chips for a 3-D "Sugarcube" Neuroprocessor;" 1944 EEE; pp. 1907-1911.

* cited by examiner

FIG.18B
FRONT VIEW
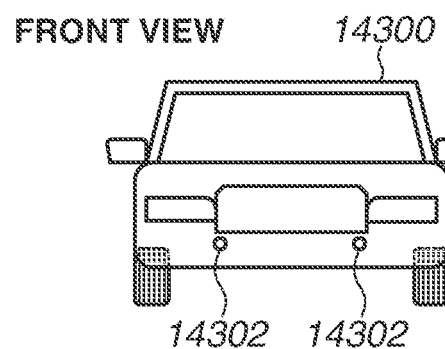
TOP VIEW
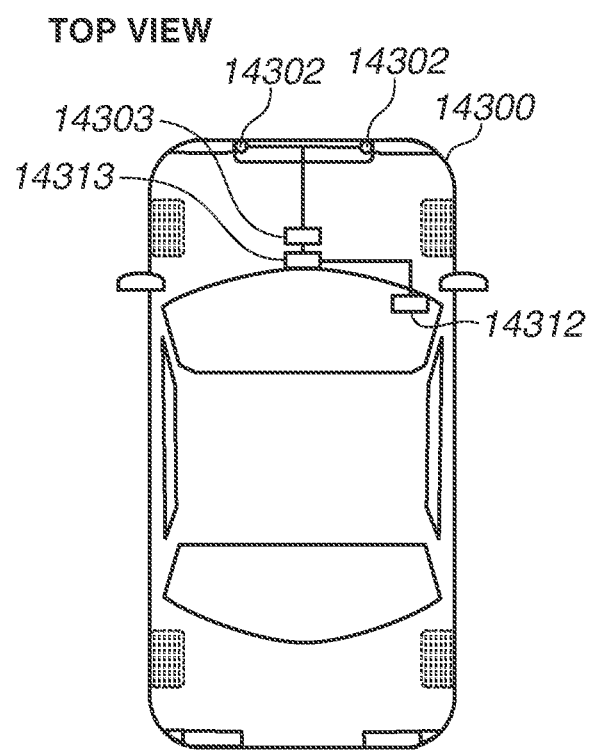
REAR VIEW
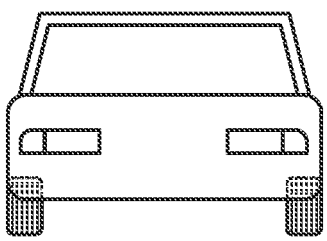

PHOTOELECTRIC CONVERSION APPARATUS, PHOTOELECTRIC CONVERSION SYSTEM, MOVING BODY

BACKGROUND OF THE INVENTION

Field of the Invention

The present invention relates to a photoelectric conversion apparatus, a photoelectric conversion system and a moving body.

Description of the Related Art

There is known a photoelectric conversion apparatus for converting incident light into electric charges that has a layered structure with a plurality of substrates layered therein.

Japanese Patent Application Laid-Open Publication No. 2020-25263 discusses a layered type light receiving sensor including a first substrate and a second substrate layered therein. The first substrate includes pixels, and the second substrate includes a signal processing circuit (digital signal processor (DSP)). The signal processing circuit performs processing based on a neural network calculation model.

SUMMARY OF THE INVENTION

A photoelectric conversion apparatus includes a first substrate including a pixel array including a plurality of pixels, a second substrate layered on the first substrate and including an analog to digital (AD) conversion portion including a plurality of AD conversion circuits configured to convert a signal output from the first substrate into a digital signal, wherein the second substrate further includes a plurality of signal processing units including a first signal processing unit configured to perform machine learning processing and a second signal processing unit configured to perform machine learning processing, wherein each of a plurality of sets includes a plurality of AD conversion circuits, and a plurality of AD conversion circuits of a set of the plurality of sets is different from a plurality of AD conversion circuits of another set of the plurality of sets, wherein the first signal processing unit is arranged to correspond to one of the plurality of sets, and wherein the second signal processing unit is arranged to correspond to another one of the plurality of sets.

Further features of the present invention will become apparent from the following description of embodiments with reference to the attached drawings.

BRIEF DESCRIPTION OF THE DRAWINGS

FIG. 18B is a diagram illustrating a moving body.

DESCRIPTION OF THE EMBODIMENTS

A processing signal processing circuit of a second substrate that is based on a neural network calculation model has a high power consumption and generates heat that increases proportionally to the power consumption. The heat generated by the second substrate is transmitted to pixel arrays of a first substrate. Consequently, signals output from the pixels contain more noise. Especially local heat generation causes uneven output in an image surface. This decreases image quality and also makes it difficult to perform image quality correction processing.

Further, as the function of processing based on a neural network calculation model has been advanced, a signal processing method in which a plurality of processes is sequentially performed inhibits the signal processing speed from increasing.

The present disclosure relates to a technique advantageous to dispersion of heat generated by a second substrate and increase of the speed of processing involving machine learning by the second substrate.

Various embodiments will be described below with reference to the drawings.

In the following embodiments, mainly a photoelectric conversion apparatus will be described as an example of a photoelectric conversion apparatus. It should be noted, however, that the embodiments are not limited to photoelectric conversion apparatuses and are also applicable to anything other than a photoelectric conversion apparatus. Examples of other applications include a distance measurement apparatus (an apparatus for measuring a distance using focus detection or time-of-flight (TOF) and a light measurement apparatus (an apparatus for measuring an amount of incident light).

Each conductivity type of a transistor according to the below-described embodiments is a mere example, and the conductivity types of the transistors are not limited to those described below. The conductivity types according to the embodiments can be changed as needed, and in a case where the conductivity type of a transistor is changed, electric potentials of a gate, a source, and a drain of the transistor are also changed as needed.

For example, in a case where the conductivity type of a transistor that is operated as a switch is changed, an electric potential fed to a gate of the transistor is changed to a low level or a high level that is opposite to the level described in the embodiments. Further, each conductivity type of a semiconductor region according to the below-described embodiments is a mere example, and the conductivity types of the semiconductor regions are not limited to those described below. The conductivity types according to the embodiments can be changed as needed, and in a case where the conductivity type of a semiconductor region is changed, an electric potential of the semiconductor region is changed as needed.

Figure 1A:
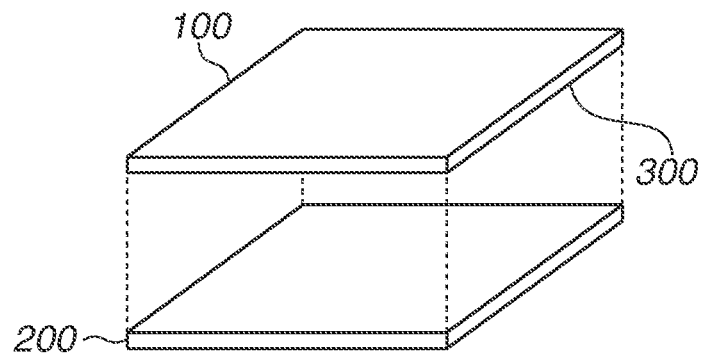
FIGS. 1A and 1B are diagrams illustrating a structure of a photoelectric conversion apparatus.
Figure 1B:
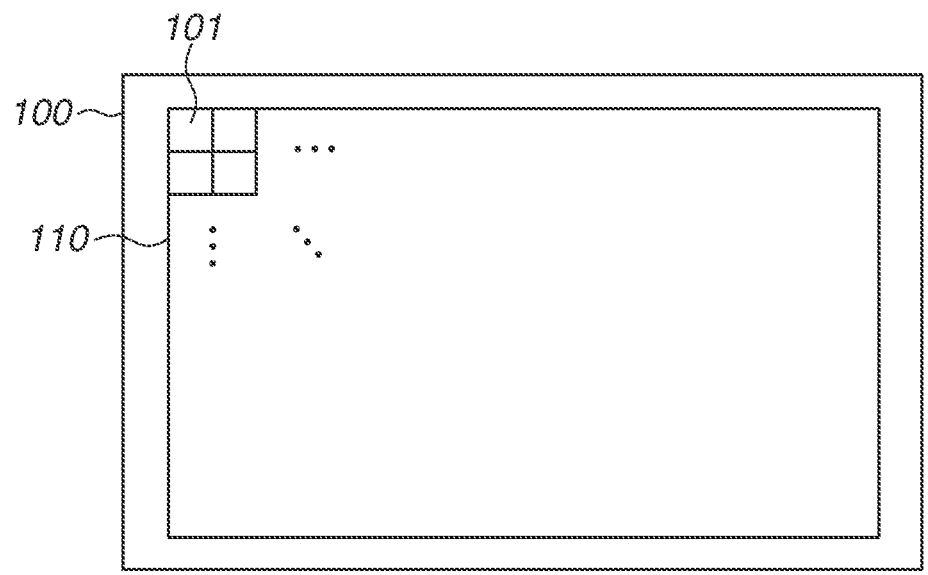

FIG. 1A is a schematic diagram illustrating a layered-type photoelectric conversion apparatus according to a first embodiment. A first substrate 100 and a second substrate 200 are semiconductor substrates, and the first substrate 100 includes a pixel array unit 110 including a plurality of unit pixels 101 arranged in a plurality of rows and a plurality of columns as illustrated in FIG. 1B. The plurality of unit pixels 101 can be arranged in a single row and a plurality of columns or can be arranged in a single column and a plurality of rows. In a photoelectric conversion apparatus for use in a digital camera, several tens of millions of the unit pixels 101 are normally arranged.

The photoelectric conversion apparatus according to the present embodiment is a backside-illuminated photoelectric conversion apparatus in which light enters from the first substrate 100 side. A signal line (not illustrated) is provided between this photoelectric conversion portion and a joint surface 300.

Figure 2:
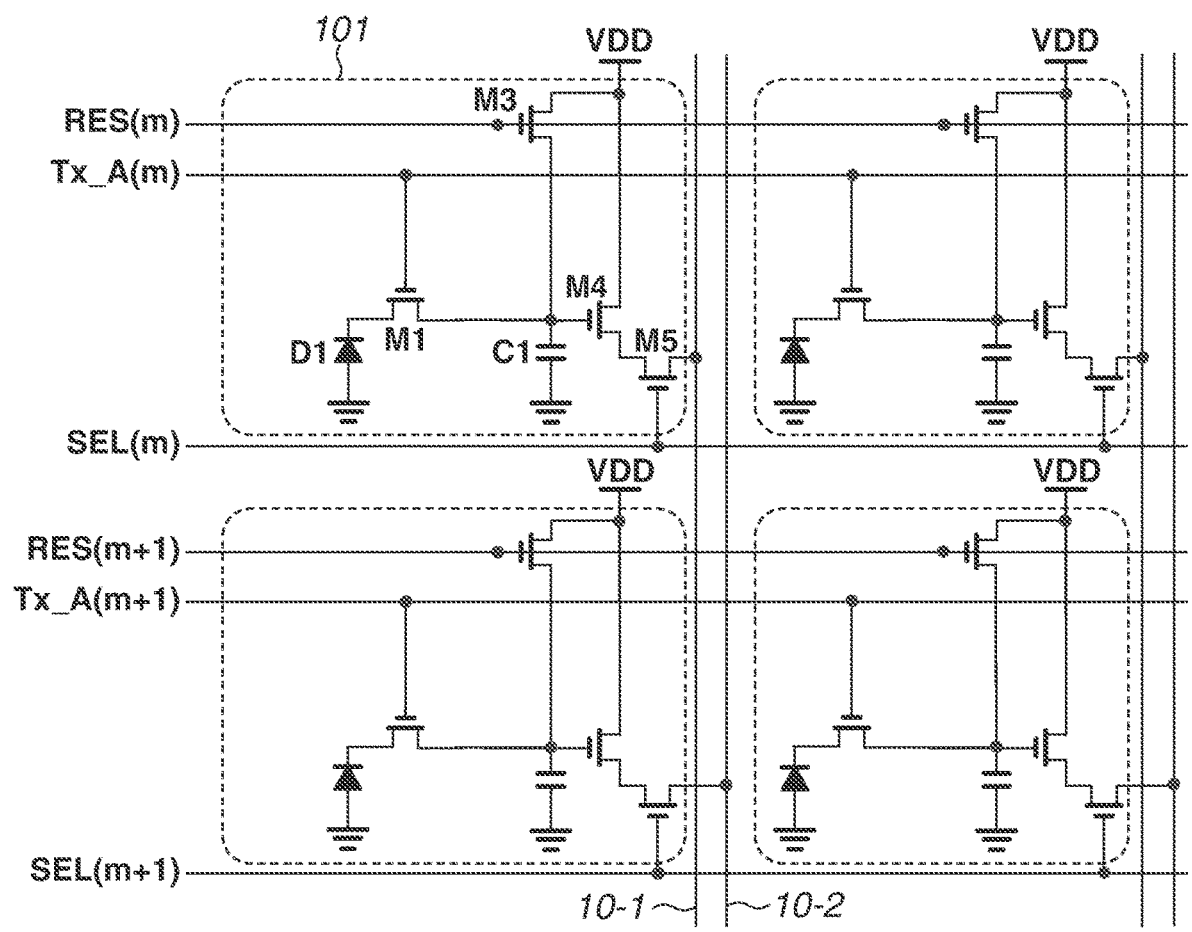
FIG. 2 is a diagram illustrating a pixel structure.

FIG. 2 is a circuit diagram illustrating circuits of two rows by two columns of the unit pixels 101 among the unit pixels 101 illustrated in FIG. 1. Hereinafter, electric charges that photodiodes as a photoelectric conversion portion accumulate are electrons. All transistors of the unit pixel 101 are N-type transistors. Alternatively, electric charges that photodiodes accumulate can be holes. In this case, the transistors of the unit pixels 101 can be P-type transistors. In other words, the conductivity type defined below can be changed based on the polarity of an electric charge as a signal.

Each unit pixel 101 includes a photodiode D1 serving as a photoelectric conversion portion, a transfer transistor M1, an electric charge conversion portion C1, a reset transistor M3, an amplification transistor M4, and a selection transistor M5. The transfer transistor M1 is on an electric path between the photodiode D1 and a node to which the electric charge conversion portion C1, the reset transistor M3, and the amplification transistor M4 are connected. The electric charge conversion portion C1 is also referred to as a floating diffusion portion (FD portion). A power supply voltage VDD is fed to the reset transistor M3 and the amplification transistor M4. The selection transistor M5 is on an electric path between the amplification transistor M4 and a column signal line 10. It can be said that the amplification transistor M4 is electrically connected to the vertical output line (column signal line) 10 via the selection transistor M5. The electric charge conversion portion C1 includes a floating diffusion capacitance in the semiconductor substrate and a parasitic capacitance on an electric path from the transfer transistor M1 to the amplification transistor M4 via the floating diffusion capacitance.

A signal RES, a signal Tx_A, and a signal SEL are signals fed from a vertical scan circuit (not illustrated) via control lines illustrated in FIG. 2. In FIG. 2, the pixel row to which a signal is fed is specified at the end of the signal. For example, the signal RES(m) refers to the signal RES that is fed to the unit pixels 101 of the mth row.

A current source (not illustrated) is connected to each of vertical output lines 10-1 and 10-2. In a case where the signal SEL(m) is changed to an active level, the selection transistors M5 of the unit pixels 101 of the mth row are turned on. Consequently, an electric current is fed from the current source to the amplification transistors M4 of the unit pixels 101 of the mth row. In each unit pixel 101 of the mth row, the power supply voltage VDD, the amplification transistor M4, and the current source (not illustrated) connected to the vertical output line 10-1 form a source follower circuit. Since the source follower circuit is formed, the amplification transistor M4 outputs a signal based on an electric potential of the electric charge conversion portion C1 to the vertical output line 10-1 via the selection transistor M5.

Further, in a case where the signal SEL(m+1) is changed to an active level, the selection transistors M5 of the unit pixels 101 of the (m+1)th row are turned on. Consequently, an electric current is fed from the current source to the amplification transistor M4 of the (m+1)th row. In each unit pixel 101 of the (m+1)th row, the power supply voltage VDD, the amplification transistor M4, and the current source (not illustrated) connected to the vertical output line 10-2 form a source follower circuit. Since the source follower circuit is formed, the amplification transistor M4 outputs a signal based on the electric potential of the electric charge conversion portion C1 to the vertical output line 10-2 via the selection transistor M5.

As described above, the unit pixels 101 of the mth row and the unit pixels 101 of the (m+1)th row are connected to the different vertical output lines 10.

The structure illustrated in FIG. 2 is a mere example, and one vertical output line 10 or two or more vertical output lines 10 can be provided to a single column of the unit pixels 101. Further, the photoelectric conversion portion can be an avalanche photodiode or can be anything that performs photoelectric conversion.

Figure 3:
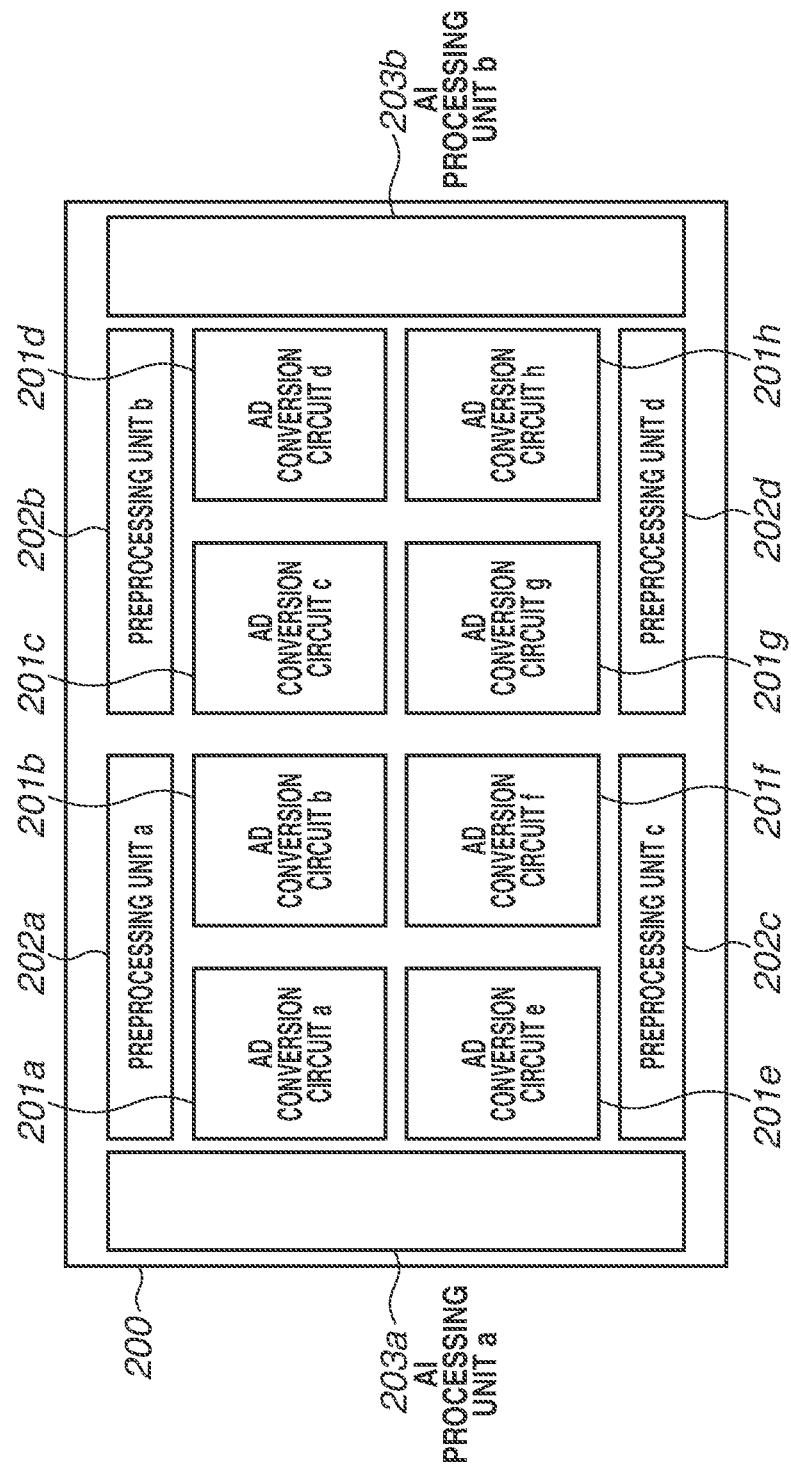
FIG. 3 is a diagram illustrating a structure of a second substrate according to a first embodiment.

The second substrate 200 includes a plurality of analog/digital (AD) conversion circuits 201a to 201h as illustrated in FIG. 3. The plurality of AD conversion circuits 201a to 201h converts analog signals output from the unit pixels 101 into digital signals. The second substrate 200 further includes a plurality of preprocessing units 202a to 202d. The plurality of preprocessing units 202a to 202d converts digital data output from the AD conversion circuits 201a to 201h into image data.

The second substrate 200 further includes a plurality of artificial intelligence (AI) processing units 203a and 203b. The plurality of AI processing units 203a and 203b each serve as a signal processing unit that executes processing based on a neural network calculation model on image data converted by the preprocessing units 202a to 202d. The AI processing units 203a and 203b include a memory unit storing a trained model trained with a weight coefficient of a neural network.

The first substrate 100 and the second substrate 200 illustrated in FIGS. 1A, 1B, and 3 are joined together with the joint surface 300 to form the layered-type photoelectric conversion apparatus.

In FIGS. 1A, 1B, and 3, the unit pixels 101, the AD conversion circuits 201a to 201h, the preprocessing units 202a to 202d, and the AI processing units 203a and 203b are illustrated as elements of the photoelectric conversion apparatus. Besides the foregoing elements, the first substrate 100 includes the control lines for controlling the unit pixels 101 and the vertical output lines 10 for transmitting signals output from the unit pixels 101 as appropriate, as illustrated in FIG. 2. Further, the first substrate 100 or the second substrate 200 includes the vertical scan circuit, a driving circuit such as a timing generator, and an output circuit for outputting image data as needed.

An analog signal output from each of the unit pixels 101 of the first substrate 100 is input to a nearby AD conversion circuit among the AD conversion circuits 201a to 201h of the second substrate 200 based on the location of the unit pixel 101 on the first substrate 100. For example, an analog signal output from the upper left pixel 101 viewed from the top in FIG. 1B is input to the AD conversion circuit 201a at the upper left of the second substrate 200. Similarly, an analog signal output from the lower right pixel 101 is input to the AD conversion circuit 201h at the lower right of the second substrate 200. Each of the AD conversion circuits 201a to 201h includes a plurality of AD converters arranged in a plurality of rows and a plurality of columns. Each of the plurality of AD converters is arranged to correspond to one of the vertical output lines 10-n illustrated in FIG. 2. The AD conversion form of the AD converters is not particularly limited, and various forms of AD conversion such as slope AD conversion, $\Delta\Sigma$ AD conversion, and sequential comparison AD conversion can be applied.

Next, digital data, i.e., a digital signal output from each of the AD conversion circuits 201a to 201h, is input to a nearby preprocessing unit among the preprocessing units 202a to 202d of the second substrate 200 based on the location of the AD conversion circuit on the second substrate 200. For example, digital data output from the AD conversion circuit 201a or 201b is input to the preprocessing units 202a. Similarly, digital data output from the AD conversion circuit 201g or 201h is input to the preprocessing unit 202d.

The preprocessing units 202a to 202d each perform signal processing on a digital signal output from the corresponding AD conversion circuits 201. A process corresponding to part of image processing, such as correlated double sampling (CDS), offset removal, and amplification processing, can be performed in the signal processing. For example, in a case where processing target image data is a color image, the preprocessing unit 202 converts the format of the image data into a luma-blue-red (YUV) image data format or a red-green-blue (RGB) image data format. Further, the preprocessing unit 202 performs, for example, processing such as noise removal and white balance adjustment as needed on processing target image data. Furthermore, the preprocessing unit 202 performs various types of signal processing (also referred to as "preprocessing") on processing target image data as needed for the AI processing unit 203 to process the image data.

The AI processing units 203a and 203b perform processing based on a neural network calculation model on image data converted by a nearby preprocessing unit among the preprocessing units 202a to 202d. For example, image data converted by the preprocessing unit 202a or 202c is processed by the AI processing unit 203a, whereas image data converted by the preprocessing unit 202b or 202d is processed by the AI processing unit 203b.

An AD conversion portion includes AD conversion circuits 201a to 201h. The AD conversion portion includes two AD conversion circuits as a plurality of sets. One set includes the AD conversion circuits 201a and 201b, and another includes the AD conversion circuits 201c and 201d. One preprocessing unit 202 is provided for two AD conversion circuits of one set. In other words, one set includes two AD conversion circuits and one preprocessing unit. Each of the AI processing units 203a and 203b is arranged to correspond to two sets.

The AI processing unit 203a serving as a first signal processing unit is arranged to correspond to the AD conversion circuits 201a and 201b included in one set of the plurality of sets. Further, the AI processing unit 203b serving as a second signal processing unit is arranged to correspond to the AD conversion circuits 201c and 201d included in another set of the plurality of sets. Further, the plurality of sets is arranged in a plurality of rows and a plurality of columns. The plurality of sets is arranged between the first and second signal processing units.

The AI processing units 203a and 203b are respectively located on the left and right sides of the second substrate 200 as illustrated in FIG. 3. Processing based on a neural network calculation model is generally high in power consumption and causes the AI processing unit 203 to generate a great amount of heat. Heat generated by the second substrate 200 is transmitted to the first substrate 100 via the joint surface 300 and received by the unit pixels 101 to cause an increase in dark current in the pixel array unit 110, and an uneven temperature causes non-uniform (uneven) dark current. The uneven dark current generated in the pixel array unit 110 causes uneven output of image data obtained from the layered-type photoelectric conversion apparatus, so that not only the image quality decreases but also the image quality correction processing becomes difficult.

With the plurality of AI processing units 203 arranged as illustrated in FIG. 3, local heat generation in the second substrate 200 is reduced. This reduces the non-uniformity of dark current and reduces uneven output of image data. Further, a plurality of AD conversion circuits forms a single set, and an AI processing unit 203 is arranged to correspond to each of the plurality of sets. This enables parallel processing to increase the speed of machine learning processing.

Further, the AI processing units 203a and 203b are arranged to sandwich the AD conversion portion (AD conversion circuits 201a to 201h) of the second substrate 200 so that heat generated by the AI processing unit 203 is suitably dispersed. This suitably reduces an effect of heat generated at the second substrate 200 on the pixel array unit 110 of the first substrate 100.

While the AI processing units 203a and 203b are arranged near the left and right sides of the second substrate 200 according to the present embodiment, the arrangement is not limited to the above-described arrangement, and the AI processing units 203a and 203b can be arranged near upper and lower sides of the second substrate 200. Further, while the structure in which the first substrate 100 and the second substrate 200 are layered is described as an example according to the present embodiment, the structure is not limited to the above-described structure, and another semiconductor substrate can also be included. For example, a third substrate can be provided between the first substrate 100 and the second substrate 200. The third substrate can include a memory element.

Further, in order to increase the effect of dispersion of heat generated by the second substrate 200, the AI processing units 203 are desirably arranged near two sides opposed to each other, three sides, or four sides of the second substrate 200.

Furthermore, the AI processing unit 203 is arranged in a region that is not immediately below the pixel array unit 110 of the first substrate 100. This makes it possible to minimize the effect of heat generated by the AI processing unit 203 on the unit pixels 101.

Even in a case where the AI processing unit 203 is arranged immediately below the pixel array unit 110, a decrease in image data quality is still prevented by arranging the AI processing unit 203 in a region that is not immediately below a light-shielded pixel region described below in the pixel array unit 110.

Light-shielded pixels are pixels provided to detect an optical black level (black level) and are shielded from light by a light shielding film such as a metal. In a case where the amount of generated heat that the light-shielded pixels receive is small, the optical black level is normally acquired, and an output value of each unit pixel other than the light-shielded pixels that is changed by the generated heat can be corrected.

The light-shielded pixels may be arranged to surround the four sides of the pixel array unit 110 in some cases but may be also arranged along two sides in L-shape. In this case, the AI processing units 203 can be arranged only near the two sides where the light-shielded pixels are not arranged and no AI processing unit 203 is arranged near the two sides where the light-shielded pixels are arranged on a plan view of the pixel array unit 110 projected to the second substrate 200. In this case, the effect of heat generated by the AI processing unit 203 on the light-shielded pixels is reduced.

Another structure of the AI processing units 203a and 203b according to a second embodiment that is different from the structure according to the first embodiment will be described below.

Figure 4:
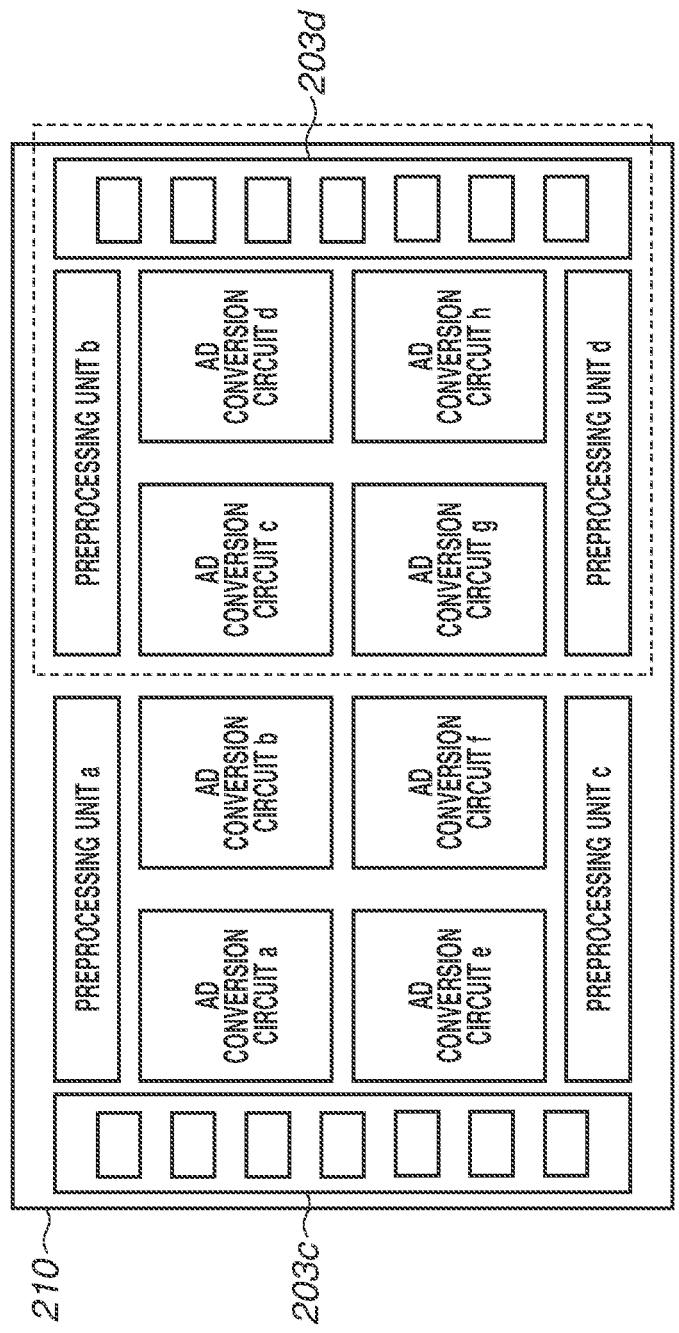
FIG. 4 is a diagram illustrating a structure of a second substrate according to a second embodiment.

FIG. 4 illustrates an example of a structure of a second substrate 210 of the photoelectric conversion apparatus according to the present embodiment. The components other than the AI processing units 203c and 203d are similar to those according to the first embodiment, so that redundant descriptions thereof are omitted.

According to the present embodiment, the AI processing units 203c and 203d have a similar structure to each other and are symmetrically arranged along left and right edges of the second substrate 210, respectively.

Figure 5:
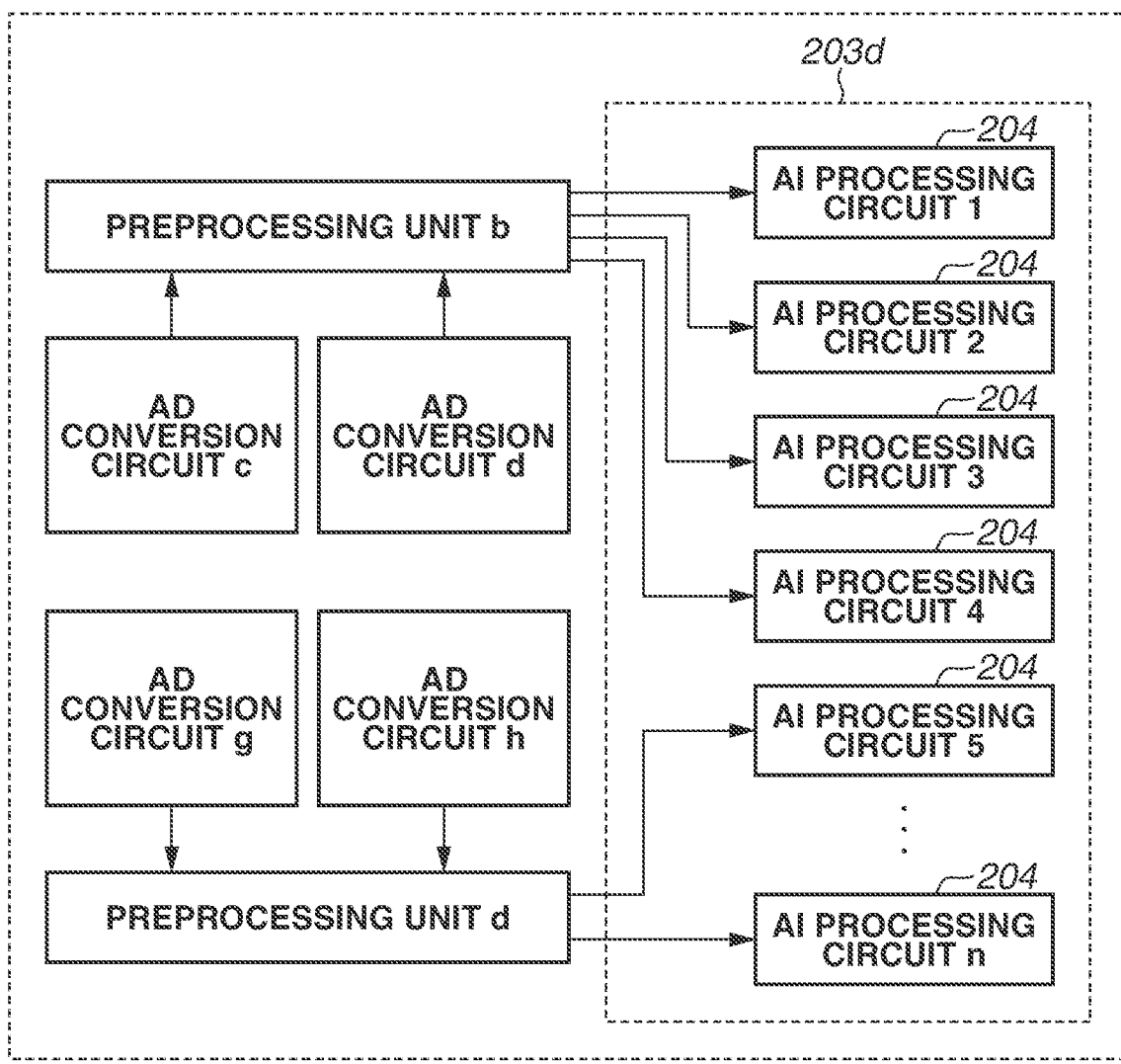
FIG. 5 is a diagram illustrating a structure of the second substrate according to the second embodiment.

FIG. 5 is an enlarged view of a portion enclosed by a dashed-line illustrated in FIG. 4. The AI processing unit 203d includes n pieces of AI processing circuits 204 having the same function, and the AI processing circuits 204 (i.e., AI processing circuits 1 to n) are electrically connected directly to the preprocessing units 202b and 202d. According to the present embodiment, the preprocessing unit 202b is connected to the AI processing circuits 1, 2, 3, and 4, and the preprocessing unit 202d is directly connected to the AI processing circuits 5 and n.

According to the present embodiment, the number of the plurality of AI processing circuits 204 of the plurality of AI processing units 203 is greater than the number of the preprocessing circuits 202 of the second substrate 200. This suitably reduces heat generated by machine learning processing.

According to the present embodiment, the signal processing units that perform processing based on a neural network calculation model are more dispersed so that heat generated by the second substrate 210 can be dispersed. This reduces the effect of heat generated at the second substrate 200 on the pixel array unit 110 of the first substrate 100.

As described above, the processing based on a neural network calculation model is performed in parallel using the plurality of AI processing circuits 204 to increase the processing speed.

Figure 6:
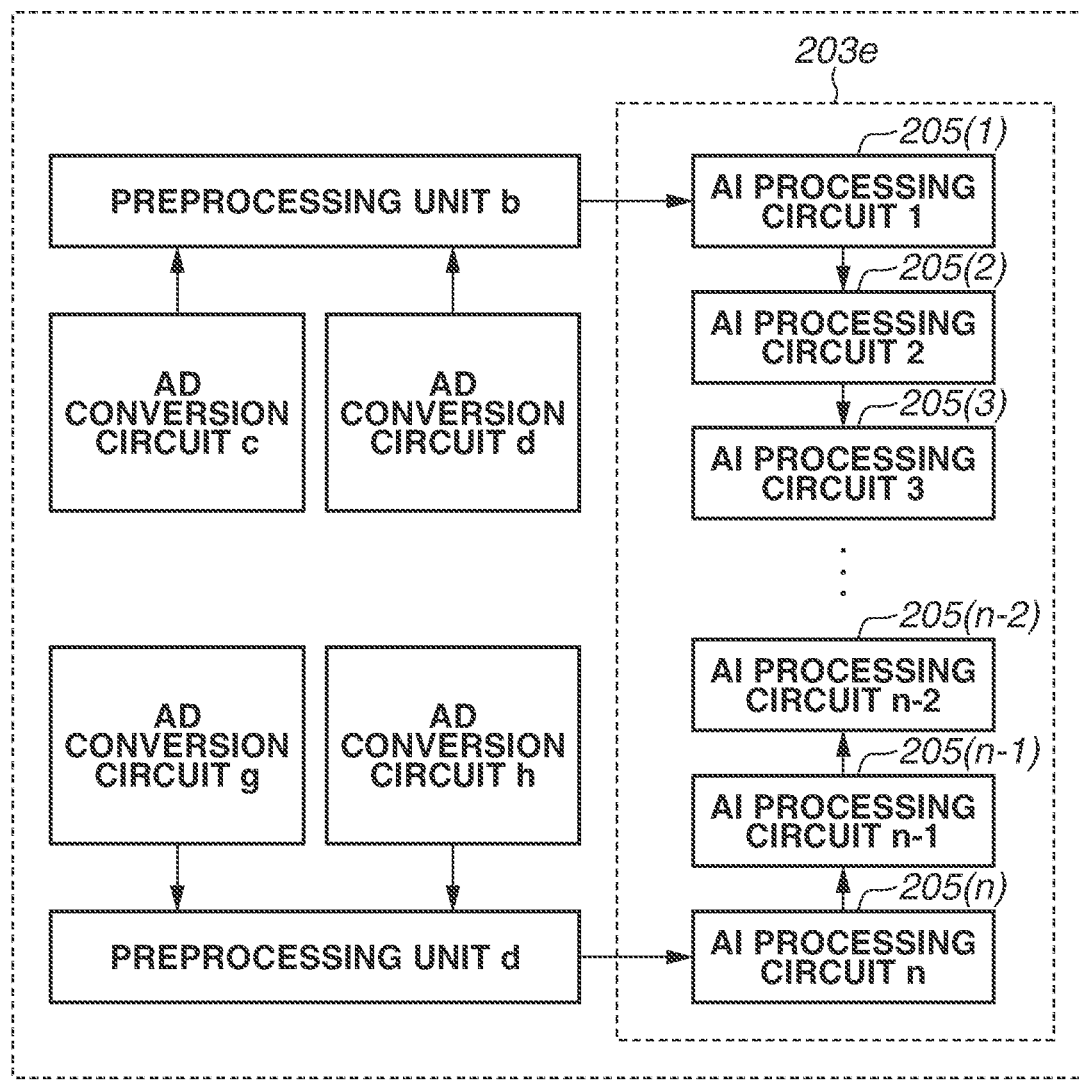
FIG. 6 is a diagram illustrating a structure of a second substrate according to a third embodiment.

A modified example of the AI processing unit 203 according to the second embodiment will be described below as a third embodiment. FIG. 6 is an enlarged view illustrating the portion enclosed by the dashed-line according to the second embodiment illustrated in FIG. 4. According to the present embodiment, an AI processing unit 203e illustrated in FIG. 6 is provided as the AI processing unit 203d illustrated in FIG. 4. The AI processing unit 203c illustrated in FIG. 4 includes a similar structure to the structure of the AI processing unit 203e illustrated in FIG. 6.

The components other than the AI processing unit 203e are similar to those according to the first or second embodiment, so that redundant descriptions thereof are omitted.

The AI processing unit 203e includes n pieces of AI processing circuits 205 having a fixed circuit structure configured to execute stage-by-stage data processing, and each of the AI processing circuits 205(1) to 205(n) is electrically connected in series.

In the present embodiment, execution of AI processing in three stages will be described as an example. Image data converted by the preprocessing unit 202 is passed to the AI processing circuits 205(1), 205(2), and 205(3) in this order, and each of the AI processing circuits 205(1), 205(2), and 205(3) performs processing based on a neural network calculation model.

Two-parallel processing of image data converted by the preprocessing units 202b and 202d located on the upper and lower sides of the second substrate 200 will be described as an example according to the present embodiment will be described below. At this time, the AI processing circuit 205(1) is electrically connected directly to the preprocessing unit 202b, and the AI processing circuit 205(n) is electrically connected directly to the preprocessing unit 202d.

Figure 7:
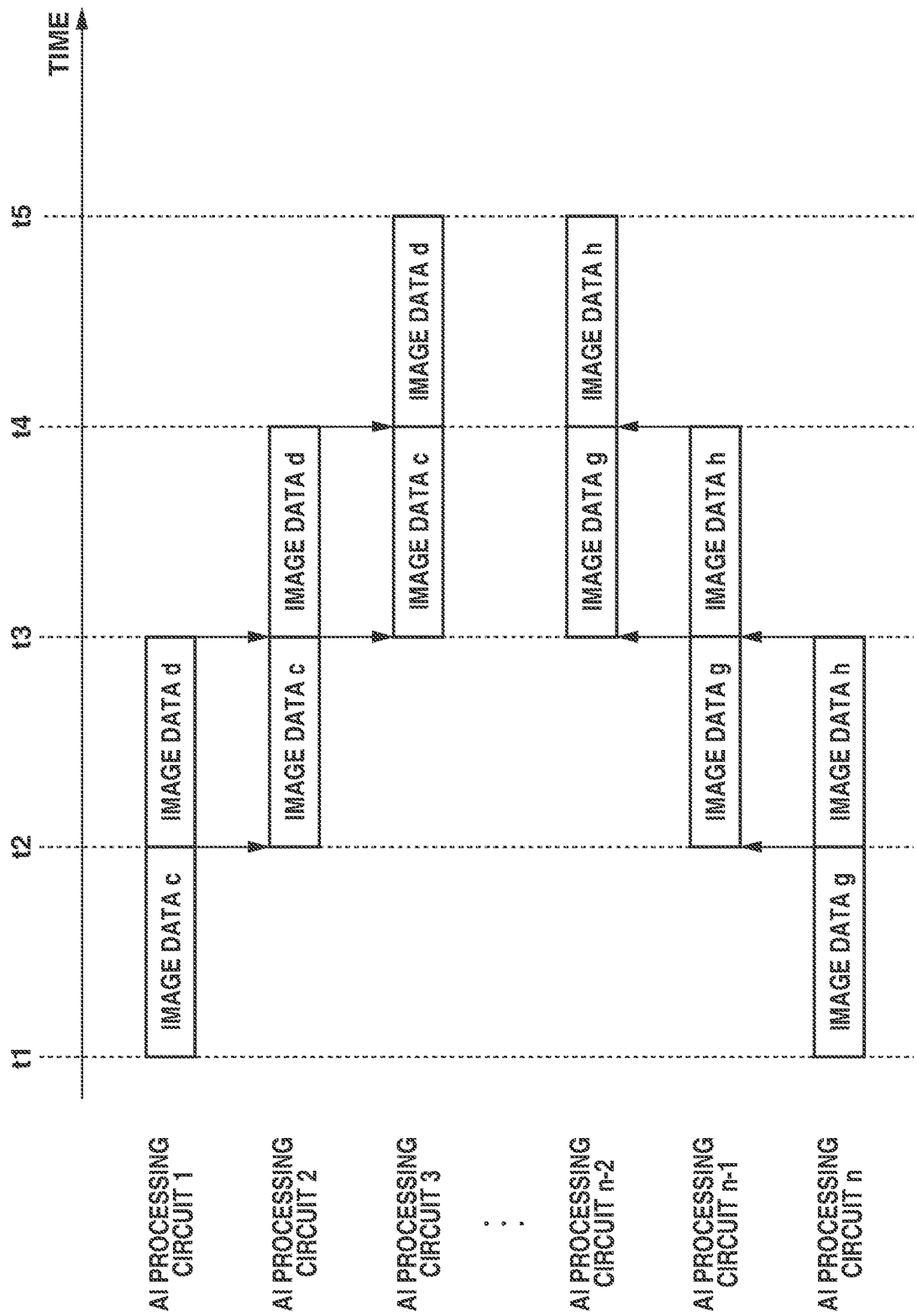
FIG. 7 is a diagram illustrating an operation of the second substrate according to the third embodiment.

FIG. 7 is a timing chart schematically illustrating calculation operations based on a neural network calculation model that are performed by the AI processing circuits 205 according to the present embodiment. From time t1 to time t2, the AI processing circuit 205(1) performs processing based on a neural network calculation model on image data (hereinafter, referred to as "image data c") converted by the preprocessing unit 202b. The image data c is based on digital data output from the AD conversion circuit 201c.

Next, from time t2 to time t3, the AI processing circuit 205(1) performs processing based on a neural network calculation model on image data (hereinafter, referred to as "image data d") converted by the preprocessing unit 202b. The image data d is based on digital data output from the AD conversion circuit 201d.

The image data c is processed by the AI processing circuit 205(1) from time t1 to time t2. Further, the image data c is processed by another AI processing circuit 205, i.e., AI processing circuit 205(2), from time t2 to time t3. The AI processing circuits 205(1) and (2) have respective neural network calculation models different from each other. Thus, the AI processing circuit 205(2) performs processing based on a neural network calculation model different from that used in the processing performed by the AI processing circuit 205(1).

From time t3 to time t4, AI processing circuit 205(2) processes the image data d based on a neural network calculation model different from that used in the processing performed by the AI processing circuit 205(1). Further, the AI processing circuit 205(3) processes the image data c based on a neural network calculation model different from that used in the processing performed by the AI processing circuit 205(2).

From time t4 to time t5, the AI processing circuit 205(3) processes the image data d based on a neural network calculation model different from that used in the processing performed by the AI processing circuit 205(2). Image data converted by the preprocessing unit 202d based on digital data output from the AD conversion circuit 201g will be referred to as "image data g". Further, image data converted by the preprocessing unit 202d based on digital data output from the AD conversion circuit 201h will be referred to as "image data h". Each of the image data g and the image data h is sequentially processed based on the different neural network calculation models by the AI processing circuits 205(n−2), 205(n−1), and 205(n) from time t4 to time t5. This process is as illustrated in FIG. 7.

As described above, the AI processing unit 203 of the photoelectric conversion apparatus according to the present embodiment has a multi-stage pipeline structure including three stages and performs processing based on a neural network calculation model using a sequential processing method.

The arrangement of the AI processing circuits 205 according to the present embodiment is a mere example, and the AI processing circuits 205 are desirably connected and arranged as suitable for the amount of heat each of the AI processing circuits 205 generates and the number of processing stages. In FIG. 6, the AI processing circuits 205 are arranged in series from the upper and lower edges of the second substrate 200 toward the center of the second substrate 210 in the plan view seen from the top view of the second substrate 200. The arrangement is not limited to the above-described example, and the AI processing circuits 205 can be arranged in series from the center of the second substrate 200 toward the upper and lower edges of the second substrate 200. Further, the AI processing circuits 205 connected to the preprocessing unit 202b can be arranged by the upper edge of the second substrate 200, and the AI processing circuits 205 connected to the preprocessing unit 202d can be located at the center of the second substrate 200.

In this case, image data converted by the preprocessing unit 202 is passed in the direction from the upper edge side toward the lower edge side of the second substrate 200 when viewed from above.

According to the present embodiment, the processing units that perform processing based on a neural network calculation model are more dispersed to disperse heat generated by the second substrate 200. Thus, the effect of heat generated at the second substrate 200 on the pixel array unit 110 of the first substrate 100 is reduced.

Furthermore, the processing based on a neural network calculation model is performed in parallel by the plurality of AI processing circuits 205 to increase the processing speed.

A different arrangement of AD conversion circuits and AI processing units according to a fourth embodiment will be described below.

Figure 8:
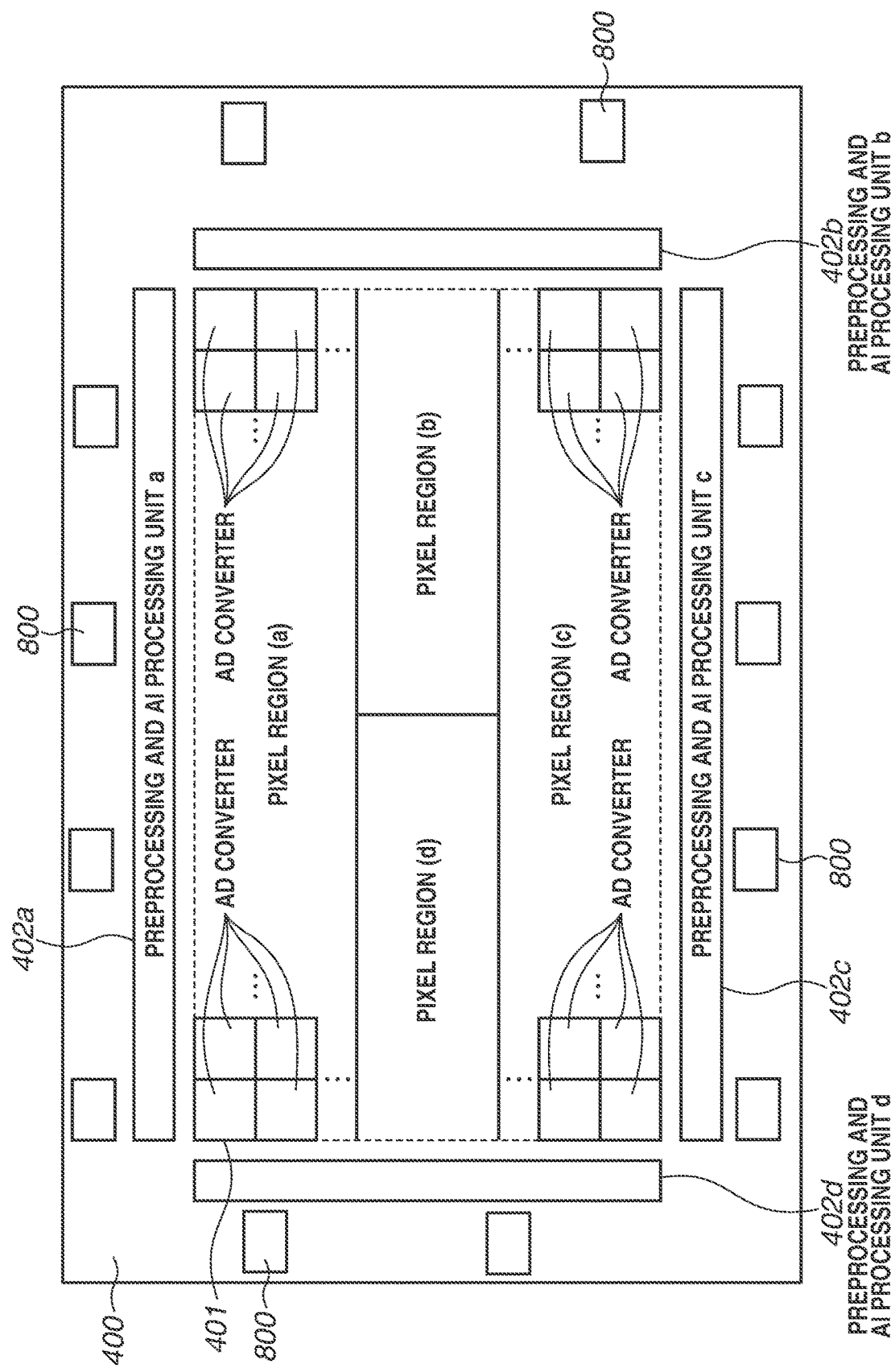
FIG. 8 is a diagram illustrating a structure of a second substrate according to a fourth embodiment.

FIG. 8 is a diagram illustrating a structure of a second substrate 400 according to the present embodiment. In a photoelectric conversion apparatus according to the present embodiment, the second substrate 400 includes one AD converter 401 for each unit pixel 101 of the first substrate 100. With this structure, analog signals output from all the unit pixels 101 are simultaneously and collectively converted into digital data by the AD converters 401.

Preprocessing and AI processing units 402a to 402d illustrated in FIG. 8 convert digital data converted by the AD converters 401 into image data. Furthermore, the preprocessing and AI processing units 402a to 402d perform processing based on a neural network calculation model on the converted image data. The preprocessing and AI processing units 402a to 402d in FIG. 8 are also referred to as circuit regions where preprocessing and AI processing are performed.

In FIG. 8, pads 800 are provided on the four sides of the second substrate 200. A signal (including power supply voltage) from a source outside the photoelectric conversion apparatus is input to the pads 800, or the pads 800 output a signal to a destination outside the photoelectric conversion apparatus. The plurality of preprocessing and AI processing units 402a to 402d is located in a region between an outer periphery portion where the pads 800 are provided on the four sides and the AD conversion portion (a region formed by the AD converters 401 arranged in a plurality of rows and a plurality of columns). While the pads 800 are located on all the four sides of the second substrate 400 in FIG. 8, the pads 800 may be provided on two opposite sides of the second substrate 200.

Digital data output from an AD converter 401 is input to one of the preprocessing and AI processing units 402a to 402d based on the location of the AD converter 401 on the second substrate 400. For example, digital data output from AD converters 401 in a pixel region (a), digital data output from AD converters 401 in a pixel region (b), digital data output from AD converters 401 in a pixel region (c), and digital data output from AD converters 401 in a pixel region (d) in FIG. 8 are respectively input to the preprocessing and AI processing units 402a, 402b, 402c, and 402d.

As described above, a plurality of regions including elements configured to perform processing based on a neural network calculation model is arranged at substantially regular intervals. This makes it possible to disperse heat generated by the preprocessing and AI processing units 402a to 402d in the second substrate 400. Thus, the effect of heat generated at the second substrate 400 on the pixel array unit 110 of the first substrate 100 is reduced.

Furthermore, parallel processing based on a neural network calculation model is performed by the plurality of preprocessing and AI processing units 402a to 402d to increase the processing speed as in the second embodiment.

Further, AI processing units according to the present embodiment may have a circuit structure configured to perform stage-by-stage data processing as in the third embodiment. Specifically, the AI processing circuits are electrically connected together in series to have a multi-stage pipeline structure and perform processing based on a neural network calculation model using a sequential processing method. In this case, the AI processing circuits in the preprocessing and AI processing units 402a to 402d each have a circuit structure capable of performing stage-by-stage data processing, and the preprocessing and AI processing units 402a to 402d are electrically connected together in series. As to a method of the connection, for example, the preprocessing and AI processing units 402a, 402b, 402c, and 402d connected together around the second substrate 400 can be employed, or only part of the preprocessing and AI processing units 402a to 402d can be connected. The preprocessing and AI processing units 402a and 402b are connected together, and then the preprocessing and AI processing units 402c and 402d are connected together.

Then, the preprocessing and AI processing units 402a and 402b and the preprocessing and AI processing units 402c and 402d perform sequential processing. The sequential processing by the preprocessing and AI processing units 402a and 402b and the sequential processing by the preprocessing and AI processing units 402c and 402d can be performed simultaneously in parallel.

Furthermore, a selection switch can be provided to an input stage of the preprocessing and AI processing units 402a to 402d so that the configurations of the sequential processing and the parallel processing are made variable.

In the first to fourth embodiments, examples where a plurality of AI processing units arranged to correspond to a plurality of sets performs signal processing involving machine learning processing on digital data of the corresponding set are described above.

According to a fifth embodiment, different AI processing units perform signal processing on different frames.

Figure 9:
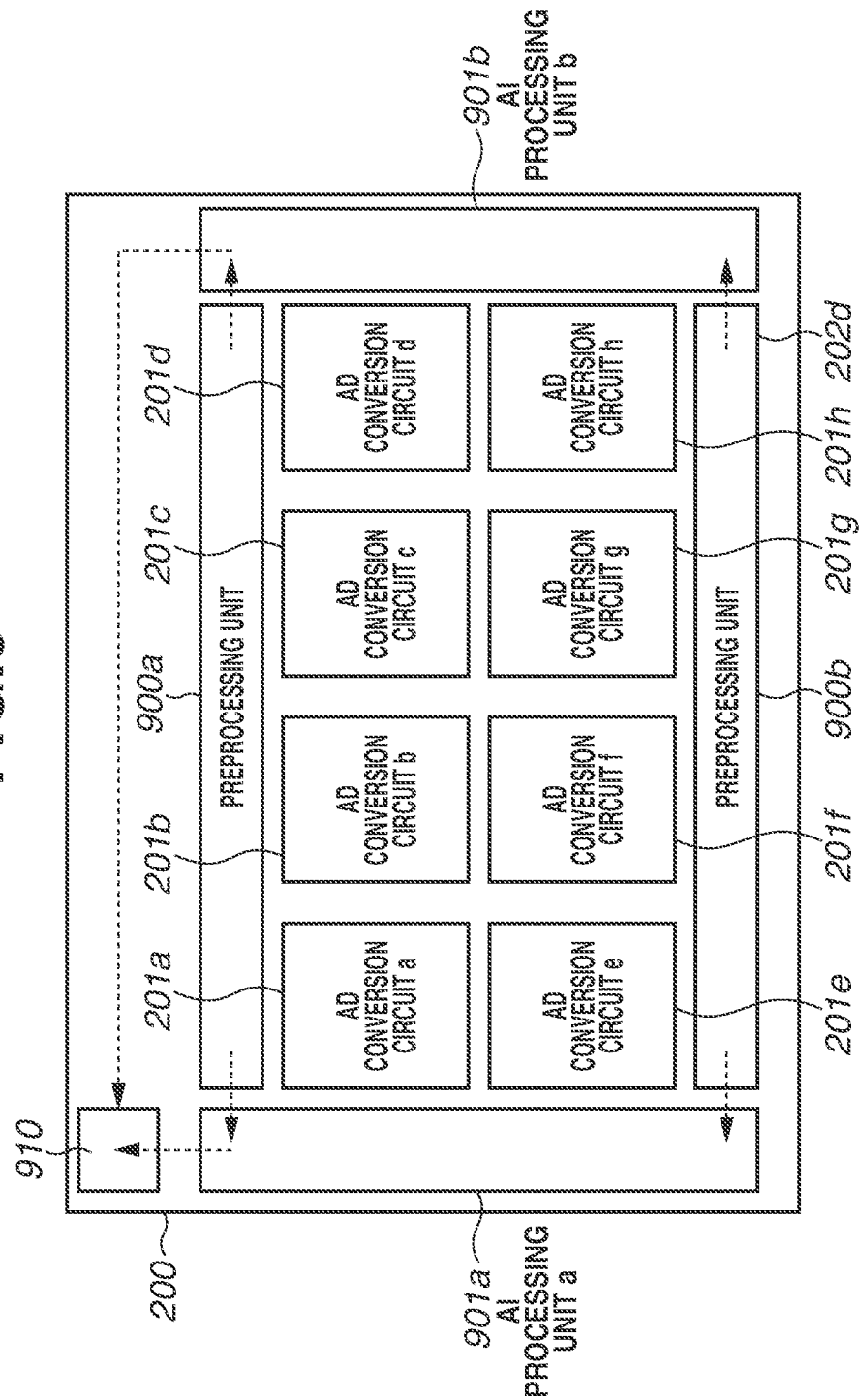
FIG. 9 is a diagram illustrating a structure of a second substrate according to a fifth embodiment.

FIG. 9 is a diagram illustrating a structure of the second substrate 200 according to the present embodiment.

A preprocessing unit 900a outputs the same data to both of AI processing units 901a and 901b.

Further, a preprocessing unit 900b outputs the same data to both of the AI processing units 901a and 901b. In other words, the same data is input to the AI processing units 901a and 901b from the plurality of preprocessing units, i.e., preprocessing units 900a and 900b. Various parameters of the AI processing units 901a and 901b are adjusted by machine learning, and the parameters of the AI processing units 901a and 901b are different from each other. Thus, even in a case where the same data is input to the AI processing units 901a and 901b, the AI processing units 901a and 901b may output different output results.

The output results of the AI processing units 901a and 901b are input to an overall processing unit 910. In a case where the output results of the AI processing units 901a and 901b are different from each other, the overall processing unit 910 performs one of the following operations.

(1) The overall processing unit 910 selects an output result with high reliability from the output results of the AI processing units 901a and 901b and outputs the selected output result to a destination outside the photoelectric conversion apparatus.

(2) The overall processing unit 910 including a lookup table selects a result corresponding to the combination of the output results of the AI processing units 901a and 901b from the lookup table and outputs the selected result.

(3) The overall processing unit 910 outputs both of the output results of the AI processing units 901a and 901b to a destination outside the photoelectric conversion apparatus and further outputs reliability information.

The reliability determination regarding the operation (1) may be performed by referring to a previous output result of the AI processing unit 901, or reliability levels of the AI processing units 901a and 901b may be provided from a source outside the photoelectric conversion apparatus. Further, the AI processing units 901a and 901b are each caused to output reliability information about the output results, and the output result with the reliability information that is higher than the other can be selected.

In the operation (3), the AI processing units 901a and 901b are each caused to output reliability information about the output results, and the reliability information is output to a destination outside the photoelectric conversion apparatus.

As described above, the plurality of AI processing units 901 of the photoelectric conversion apparatus according to the present embodiment performs signal processing involving machine learning processing on the same data. This increases the accuracy of processing results output from the AI processing units 901.

Further, the photoelectric conversion apparatus according to the present embodiment can give redundancy to the AI processing units 901. Specifically, there may be a case where a failure or a significant decrease in signal accuracy occurs in one of the AI processing units 901a and 901b. In this case, the operation of the one of the AI processing units 901a and 901b is stopped or the output result of the one of the AI processing units 901a and 901b is ignored, and the output result of the other one of the AI processing units 901a and 901b is selected. Thus, even in a case where a failure or a decrease in signal accuracy occurs in any one of the AI processing units 901a and 901b, the operation of the photoelectric conversion apparatus can be continued.

Further, the inclusion of the plurality of AI processing units 901a and 901b produces an advantage that local heat concentration is prevented as in the first embodiment. Further, since the plurality of AI processing units 901a and 901b performs signal processing, the processing speed is increased compared to a case where a single AI processing unit 901 performs signal processing involving machine learning processing a plurality of times.

According to a sixth embodiment, part of a plurality of AI processing units and another part of the plurality of AI processing units alternately perform an operation on frames. This increases the frame rate.

Figure 10:
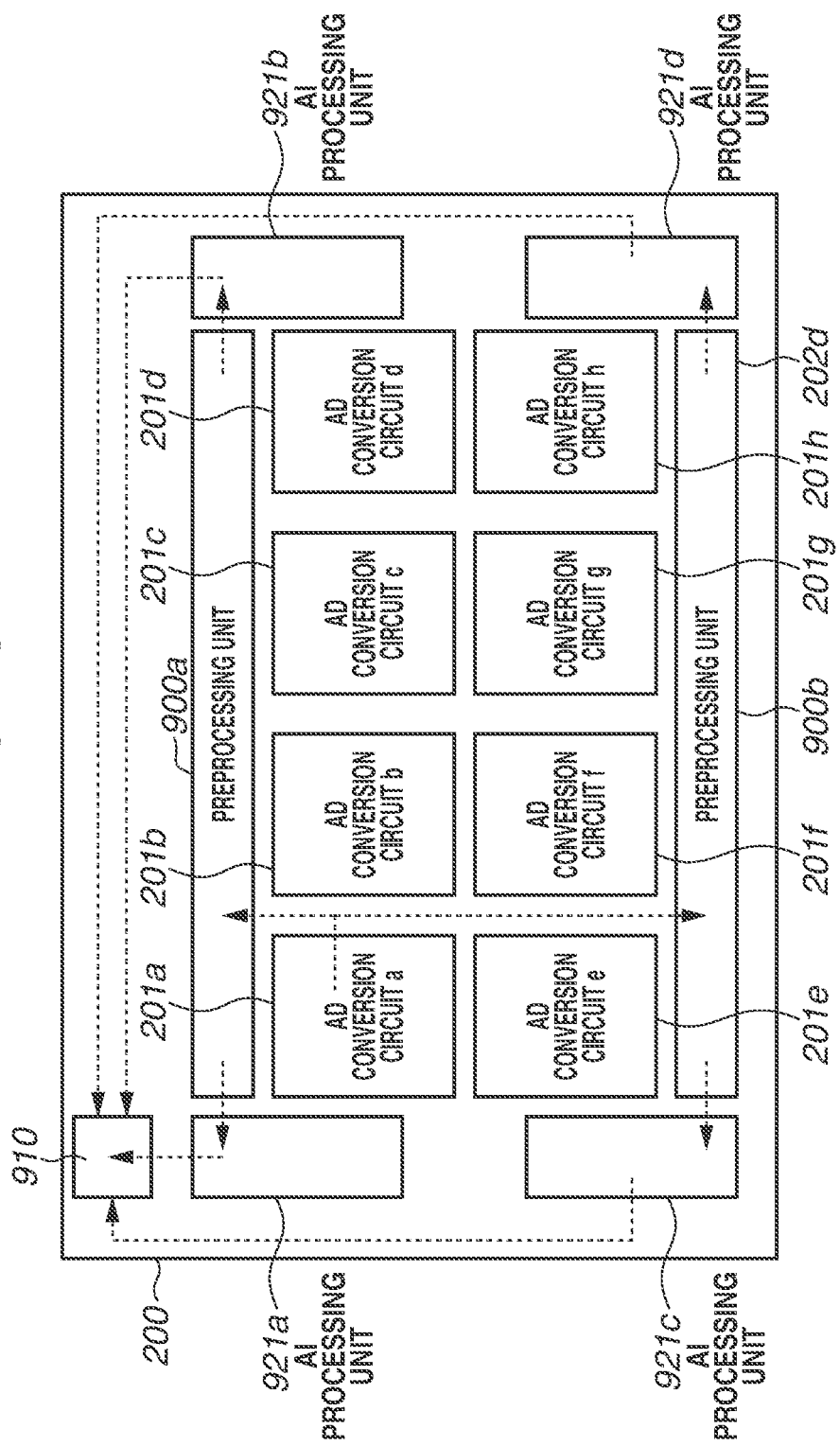
FIG. 10 is a diagram illustrating a structure of a second substrate according to a sixth embodiment.

The photoelectric conversion apparatus according to the present embodiment can have a structure similar to that according to the fifth embodiment or can have a structure including more AI processing units as illustrated in FIG. 10. The structure illustrated in FIG. 10 will be described below.

The structure illustrated in FIG. 10 includes AI processing units 921a to 921d. Further, AD conversion circuits 201a to 201h each can output digital data selectively to one of the preprocessing units 900a and 900b as illustrated with respect to the AD conversion circuit a. Further, the AD conversion circuits 201a to 201h can each have a structure to output digital data to both of the preprocessing units 900a and 900b in parallel.

Figure 11:
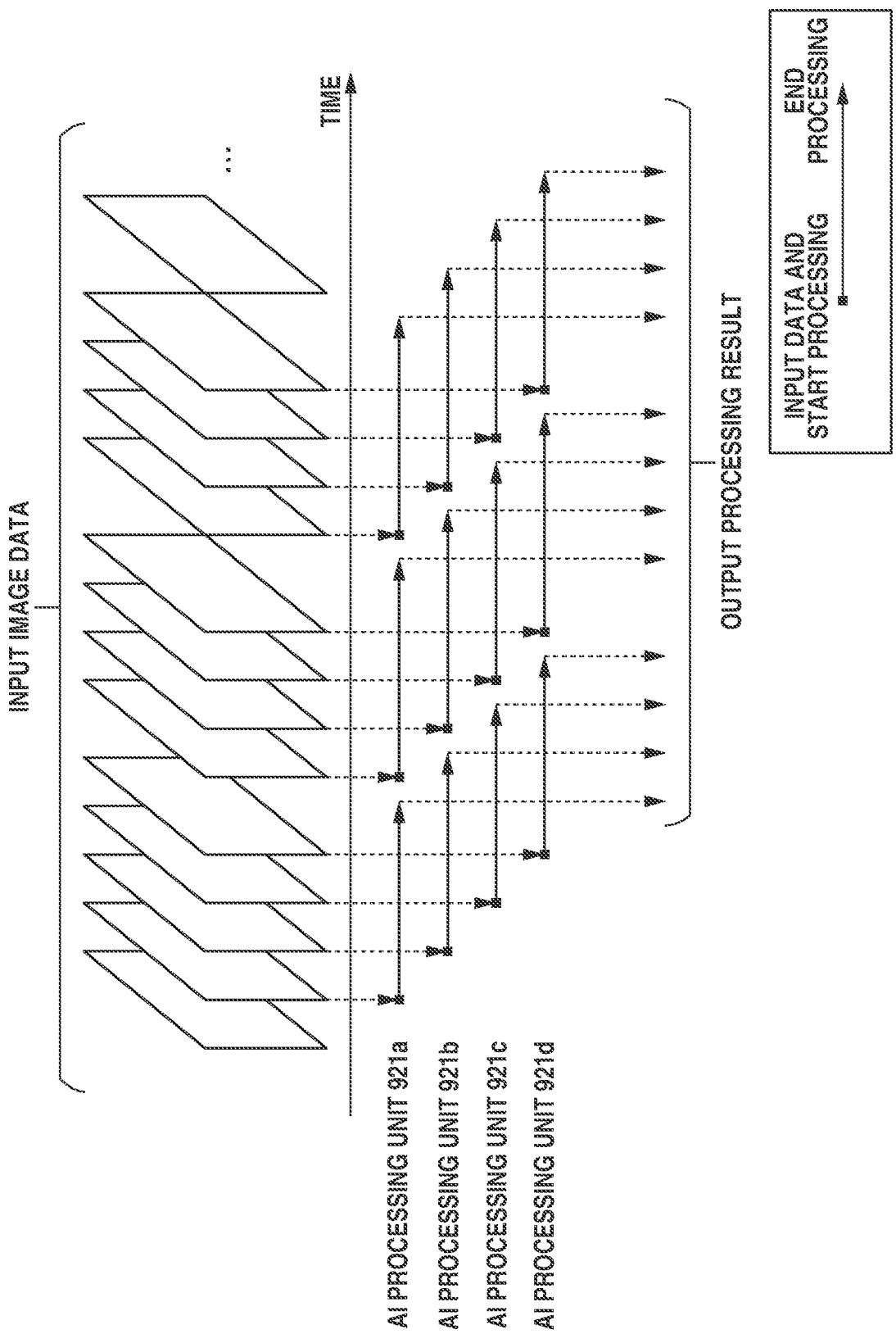
FIG. 11 is a diagram illustrating an operation of the photoelectric conversion apparatus according to the sixth embodiment.

FIG. 11 is a diagram illustrating operations performed by the AI processing units according to the present embodiment.

Image data of frames to be processed by the AD conversion circuits 201a to 201h which corresponds to the output of one screen is illustrated.

The AI processing unit 921a starts processing image data of the nth frame (n is a natural number). Thereafter, while the AI processing unit 921a is processing the image data, the AI processing unit 921b starts processing image data of the (n+1)th frame. Similarly, while the AI processing units 921a and 921b are processing the image data, the AI processing unit 921c starts processing image data of the (n+3)th frame. Similarly, while the AI processing units 921a, 921b, and 921c are processing the image data, the AI processing unit 921d starts processing image data of the (n+4)th frame.

Thereafter, the AI processing unit 921a finishes processing the image data and then starts processing image data of the (n+5)th frame. The operations are repeated similarly thereafter.

Since the preprocessing unit 900a can output digital data selectively to the AI processing units 921a or 921b, the image data of the plurality of frames can be allocated to the plurality of AI processing units 921a and 921b frame by frame. Further, in the configuration illustrated in FIG. 10, the AD conversion circuits 201a to 201h are configured to output digital data selectively to one of the preprocessing units 900*a* and 900*b* to facilitate allocation of digital data of a plurality of frames to the plurality of AI processing units 921*a* and 921*b*.

The present embodiment is not limited to the configuration illustrated in FIG. 10. For example, the AD conversion circuits 201*a* to 201*h* are configured to output digital data selectively to one of the preprocessing units 900*a* and 900*b*. Besides this configuration, the preprocessing units 900*a* and 900*b* can be combined into a single preprocessing unit 900, and the single preprocessing unit 900 can allocate data to the four AI processing units 921*a* to 921*d*. Further, the number of AI processing units 921 is not limited to four and can be any number greater than or equal to two. Further, the AI processing units 921*a* to 921*d* can have a common trained model. This makes it possible to obtain output results with equivalent reliability accuracy even in a case where different AI processing units 921 perform processing on different frames.

The plurality of AI processing units 921*a* to 921*d* can have a common trained model in a method described below. First, each of the plurality of AI processing units 921*a* to 921*d* independently performs machine learning. The machine learning can be performed either using or without using training data. After the AI processing units 921*a* to 921*d* finish machine learning, a signal indicating that an expected output result is known is input to the photoelectric conversion apparatus. A description will be given of an example where an expected output result is "a subject is a human face" and a human face is imaged by the photoelectric conversion apparatus.

Output results of the AI processing units 921*a* to 921*d* are input to the overall processing unit 910. There may be a case where one or some of the AI processing units 921*a* to 921*d* output the output result "a subject is a human face" while another one of the AI processing units 921*a* to 921*d* outputs an output result other than "a subject is a human face". In this case, the overall processing unit 910 increases the reliability of each AI processing unit 921 that outputs the correct output result (i.e., "a subject is a human face") among the AI processing units 921*a* to 921*d*. The photoelectric conversion apparatus repeats the operation of comparing the expected output result to an actual output result of each AI processing unit 921. As a result, the overall processing unit 910 identifies the AI processing unit 921 that is likely to output the correct output result among the AI processing units 921*a* to 921*d*. The overall processing unit 910 applies the trained model of the identified AI processing unit 921 to the other AI processing units 921. As a result, the plurality of AI processing units 921*a* to 921*d* has the common trained model with high reliability.

A seventh embodiment will be described below. Mainly a difference from the sixth embodiment will be described below.

The photoelectric conversion apparatus according to the present embodiment can have a structure similar to that according to the sixth embodiment.

According to the present embodiment, the overall processing unit 910 outputs a processing result to a destination outside the photoelectric conversion apparatus based on the output results of the plurality of frames output from the plurality of AI processing units 921*a* to 921*d*.

Figure 12:
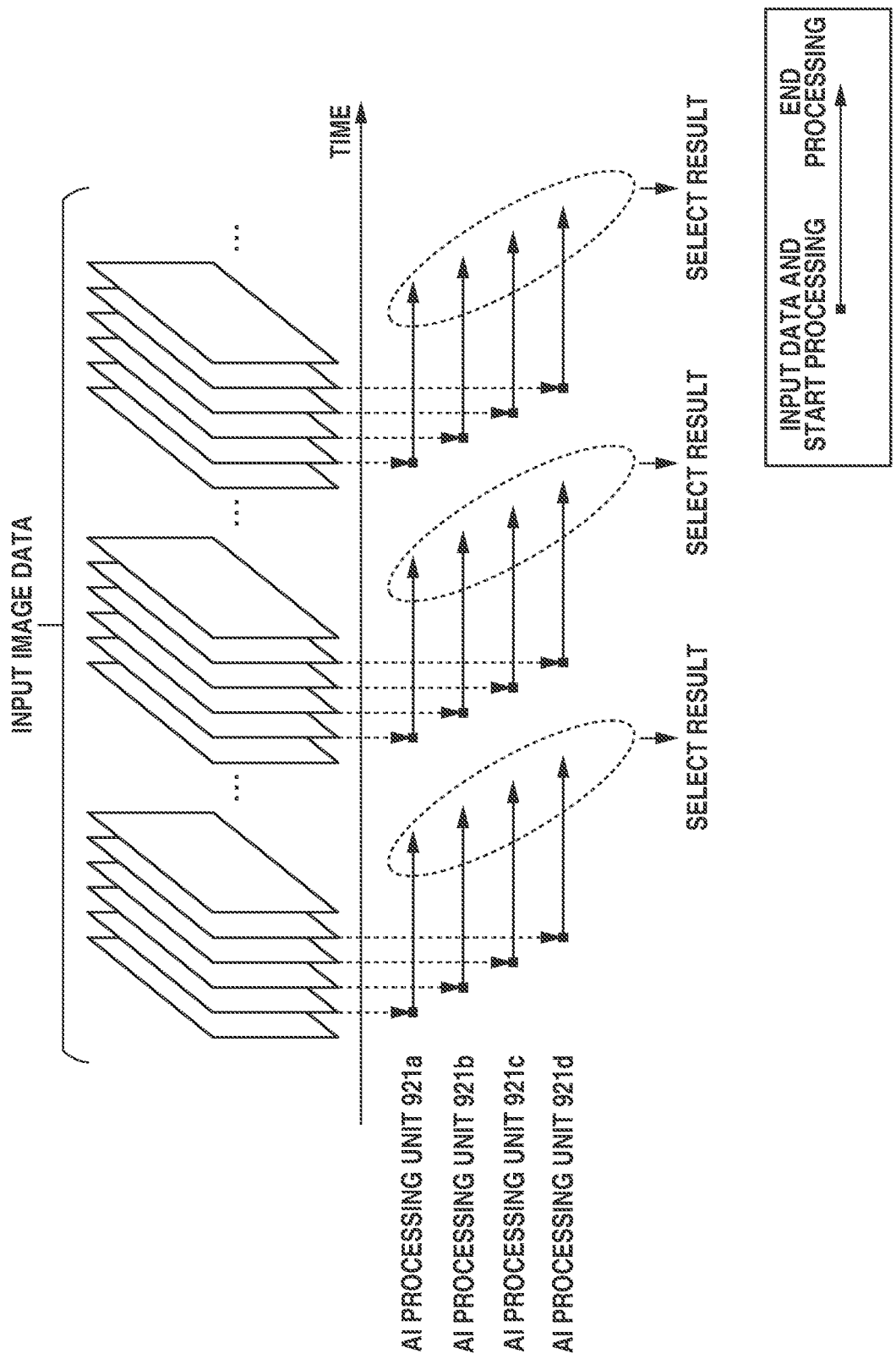
FIG. 12 is a diagram illustrating an operation of a photoelectric conversion apparatus according to a seventh embodiment.

FIG. 12 is a diagram illustrating operations performed by the AI processing units 921*a* to 921*d* illustrated in FIG. 10 according to the present embodiment. A difference from the operations illustrated in FIG. 11 is that the overall processing unit 910 performs overall determination based on output results of the plurality of AI processing units 921*a* to 921*d* and outputs the processing result to a destination outside the photoelectric conversion apparatus.

In the overall determination, for example, the most common output result among the output results of the plurality of AI processing units 921*a* to 921*d* is selected and output. In this case, the plurality of AI processing units 921*a* to 921*d* can have the same trained model as in the sixth embodiment.

Further, the plurality of AI processing units 921*a* to 921*d* can have different trained models from each other. In this form, after the AI processing units 921*a* to 921*d* finish machine learning, a signal indicating that the expected output result is known is input to the photoelectric conversion apparatus. An example where the expected output result is "a subject is a human face" and a human face is imaged by the photoelectric conversion apparatus will be described below. Output results of the AI processing units 921*a* to 921*d* are input to the overall processing unit 910. There may be a case where one or some of the AI processing units 921*a* to 921*d* output the output result "a subject is a human face" while another one of the AI processing units 921*a* to 921*d* outputs an output result other than "a subject is a human face". In this case, the overall processing unit 910 increases the reliability of each AI processing unit 921 that outputs the correct output result (i.e., "a subject is a human face") among the AI processing units 921*a* to 921*d*. The photoelectric conversion apparatus repeats the operation of comparing the expected output result to an actual output result of each AI processing unit 921. As a result, the overall processing unit 910 determines the reliability of each of the AI processing units 921*a* to 921*d*. Then, the overall processing unit 910 adds a reliability parameter to the output results of the plurality of AI processing units 921*a* to 921*d* in the operations illustrated in FIG. 12 and determines a processing result to be output to a destination outside the photoelectric conversion apparatus.

As described above, according to the present embodiment, the overall determination of the processing results of the plurality of AI processing units 921*a* to 921*d* is performed to obtain a processing result with higher reliability.

Figure 13:
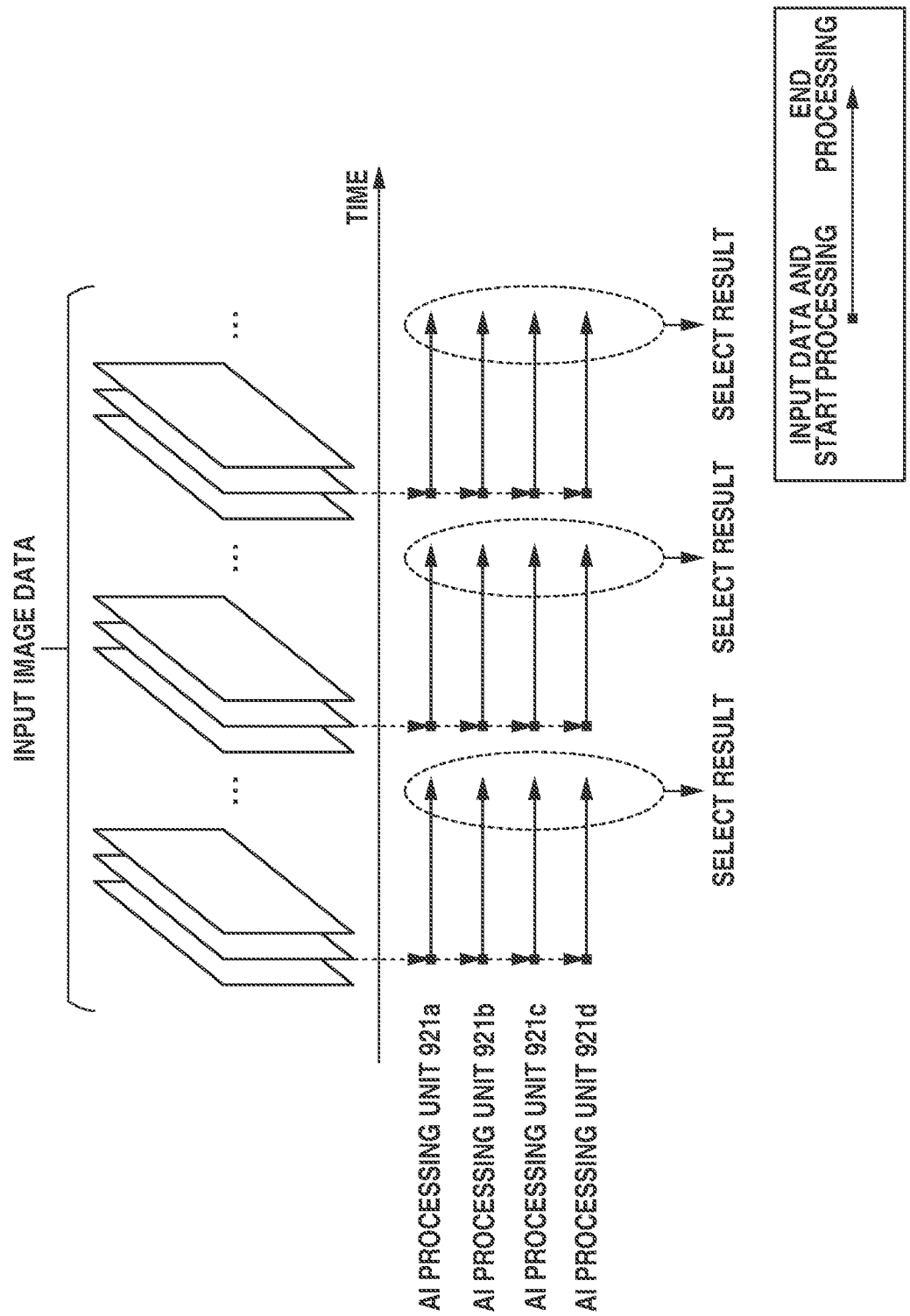
FIG. 13 is a diagram illustrating an operation of the photoelectric conversion apparatus according to the seventh embodiment.

An example where the plurality of AI processing units 921*a* to 921*d* processes image data of different frames from each other is described in the present embodiment. In another example, the plurality of AI processing units 921*a* to 921*d* can process image data of the same frame as illustrated in FIG. 13. In this case, the overall processing unit 910 may perform overall determination and output a processing result to a destination outside the photoelectric conversion apparatus as described in the present embodiment.

As described above in the embodiments, the AI processing units are arranged and configured to operate as described in the above-described embodiments so that a decrease in accuracy of image data obtained from the photoelectric conversion apparatus is prevented and the operation speed of the AI processing units increases.

Figure 14:
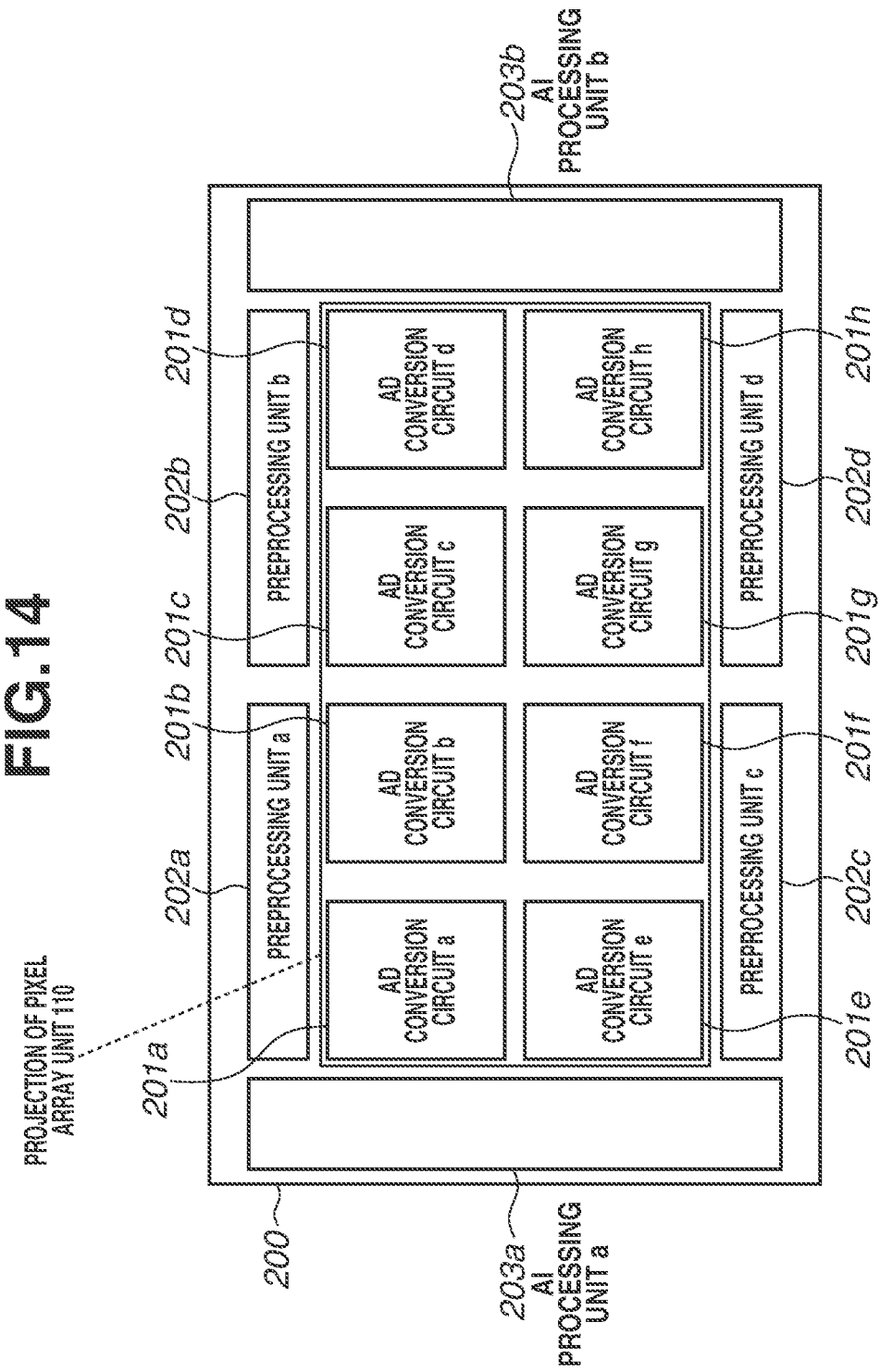
FIG. 14 is a diagram illustrating a structure of a second substrate according to the seventh embodiment.

Further, it is also effective to arrange the AI processing units 203*a* and 203*b* outside the arrangement area of the pixel array unit 110 in a plan view when viewed from the top surface side of the first and second substrates as illustrated in FIG. 14. In FIG. 14, a projection position of the pixel array unit 110 of the first substrate on the second substrate when seen in a plan view is specified. The AI processing units 203*a* and 203*b* are arranged not to overlap the pixel array unit 110 when seen in a plan view. This reduces the effect of heat generated in the AI processing units 203*a* and 203*b* on the pixel array unit 110. The preprocessing units 202*a* to 202*d* are also arranged not to overlap the pixel array unit 110 when seen in a plan view. This reduces the effect of heat generated in the preprocessing units 202a to 202d on the pixel array unit 110.

Further, the operation processing speeds of the plurality of AI processing units 203a and 203b can be different from each other. In this case, one of the AI processing units 203a and 203b that has a higher operation processing speed can be arranged farther from the position of the pixel array unit 110 than the other one of the AI processing units 203a and 203b that has a lower operation processing speed when seen in a plan view. In this case, since an AI processing unit having a higher operation processing speed generates more heat, an effect of heat generated in the AI processing units 203a and 203b on the pixel array unit 110 is reduced.

Further, while the AI processing units 203a and 203b are provided on the second substrate according to the present specification, an AI processing unit can further be provided on the first substrate.

Figure 15:
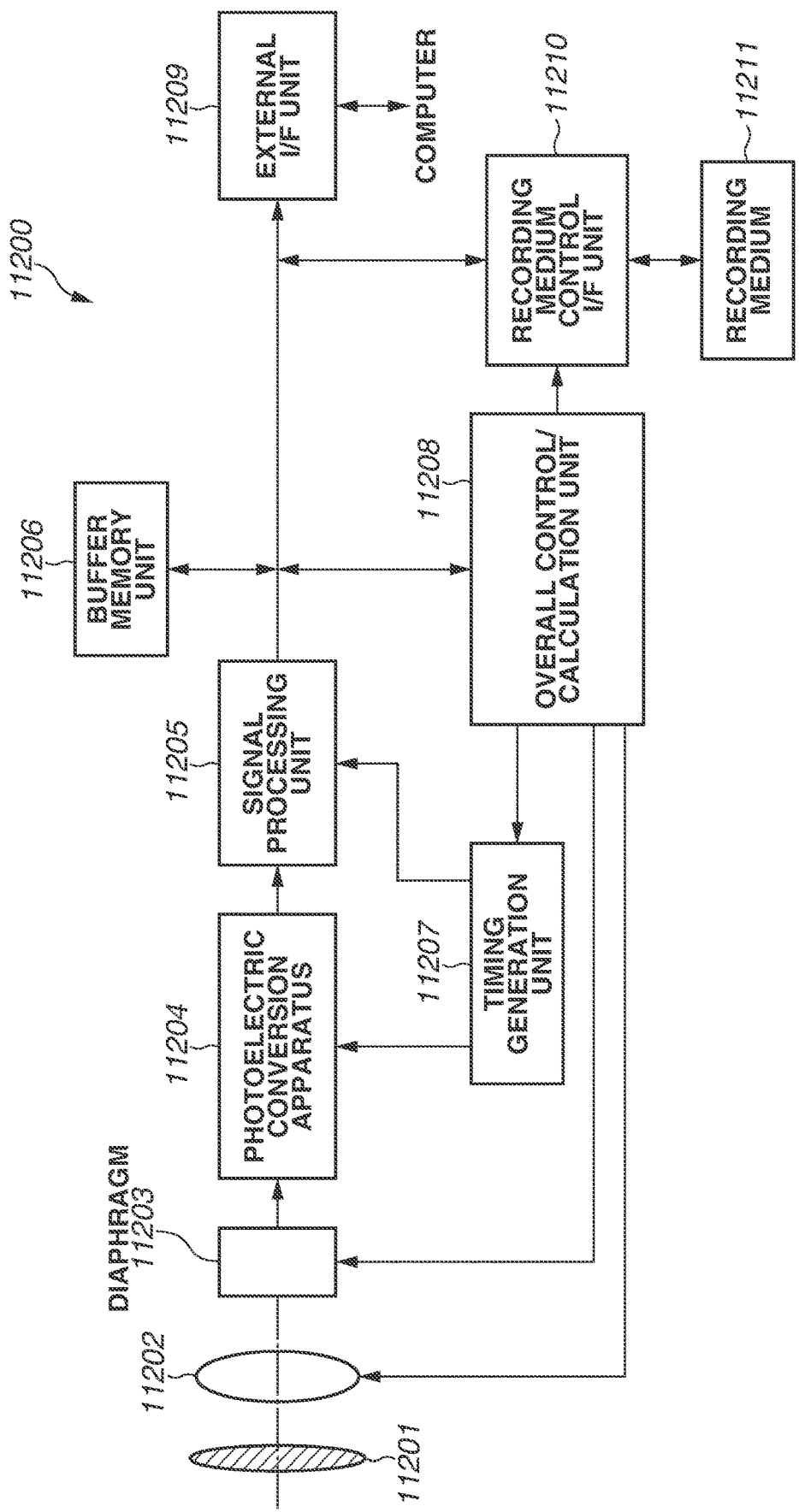
FIG. 15 is a functional block diagram illustrating a photoelectric conversion system according to an eighth embodiment.

FIG. 15 is a block diagram illustrating a configuration of a photoelectric conversion system 11200 according to an eighth embodiment. The photoelectric conversion system 11200 according to the present embodiment includes a photoelectric conversion apparatus 11204. Any one of the photoelectric conversion apparatuses according to the above-described embodiments can be applied to the photoelectric conversion apparatus 11204. The photoelectric conversion system 11200 can be used as, for example, an imaging system. Specific examples of imaging systems include digital still cameras, digital camcorders, monitoring cameras, and network cameras. FIG. 15 illustrates a digital still camera as an example of the photoelectric conversion system 11200.

The photoelectric conversion system 11200 illustrated in FIG. 15 includes the photoelectric conversion apparatus 11204 and a lens 11202. The lens 11202 forms an optical image of a subject on the photoelectric conversion apparatus 11204. The photoelectric conversion system 11200 also includes a diaphragm 11203 and a barrier 11201. The diaphragm 11203 varies the amount of light that passes through the lens 11202, and the barrier 11201 protects the lens 11202. The lens 11202 and the diaphragm 11203 constitutes an optical system that condenses light to the photoelectric conversion apparatus 11204.

The photoelectric conversion system 11200 includes a signal processing unit 11205. The signal processing unit 11205 processes output signals that are output from the photoelectric conversion apparatus 11204. The signal processing unit 11205 performs signal processing such as various types of correction and compression as needed on an input signal and outputs the processed signal. The photoelectric conversion system 11200 further includes a buffer memory unit 11206 and an external interface (external I/F) unit 11209. The buffer memory unit 11206 temporarily stores image data, and the external I/F unit 11209 is an interface for communication with an external computer. The photoelectric conversion system 11200 further includes a recording medium 11211 and a recording medium control interface unit (recording medium control I/F) 11210. The recording medium 11211 is a semiconductor memory for recording and reading captured data, and the recording medium control I/F unit 11210 is an interface for recording to and reading from the recording medium 11211. The recording medium 11211 can be built in the photoelectric conversion system 11200 or can be attachable to and removable from the photoelectric conversion system 11200. Further, communication from the recording medium control I/F unit 11210 to the recording medium 11211 and communication from the external I/F unit 11209 can be performed wirelessly.

The photoelectric conversion system 11200 further includes an overall control/calculation unit 11208 and a timing generation unit 11207. The overall control/calculation unit 11208 performs various types of calculation and controls the entire digital still camera. The timing generation unit 11207 outputs various timing signals to the photoelectric conversion apparatus 11204 and the signal processing unit 11205. The timing signals can be input from an external source, and the photoelectric conversion system 11200 can be configured to include at least the photoelectric conversion apparatus 11204 and the signal processing unit 11205 for processing output signals that are output from the photoelectric conversion apparatus 11204. The overall control/calculation unit 11208 and the timing generation unit 11207 can be configured to perform part of or entire control function of the photoelectric conversion apparatus 11204.

The photoelectric conversion apparatus 11204 outputs image signals to the signal processing unit 11205. The signal processing unit 11205 performs predetermined signal processing on an image signal output from the photoelectric conversion apparatus 11204 and outputs image data. Further, the signal processing unit 11205 generates an image using an image signal. The signal processing unit 11205 can perform distance measurement calculation on a signal output from the photoelectric conversion apparatus 11204. The signal processing unit 11205 and/or the timing generation unit 11207 can be mounted on the photoelectric conversion apparatus. Specifically, the signal processing unit 11205 and the timing generation unit 11207 can be provided on a substrate including pixels arranged thereon or on another substrate. Using a photoelectric conversion apparatus according to any one of the above-described embodiments, an imaging system capable of acquiring images with better quality is realized.

Figure 16:
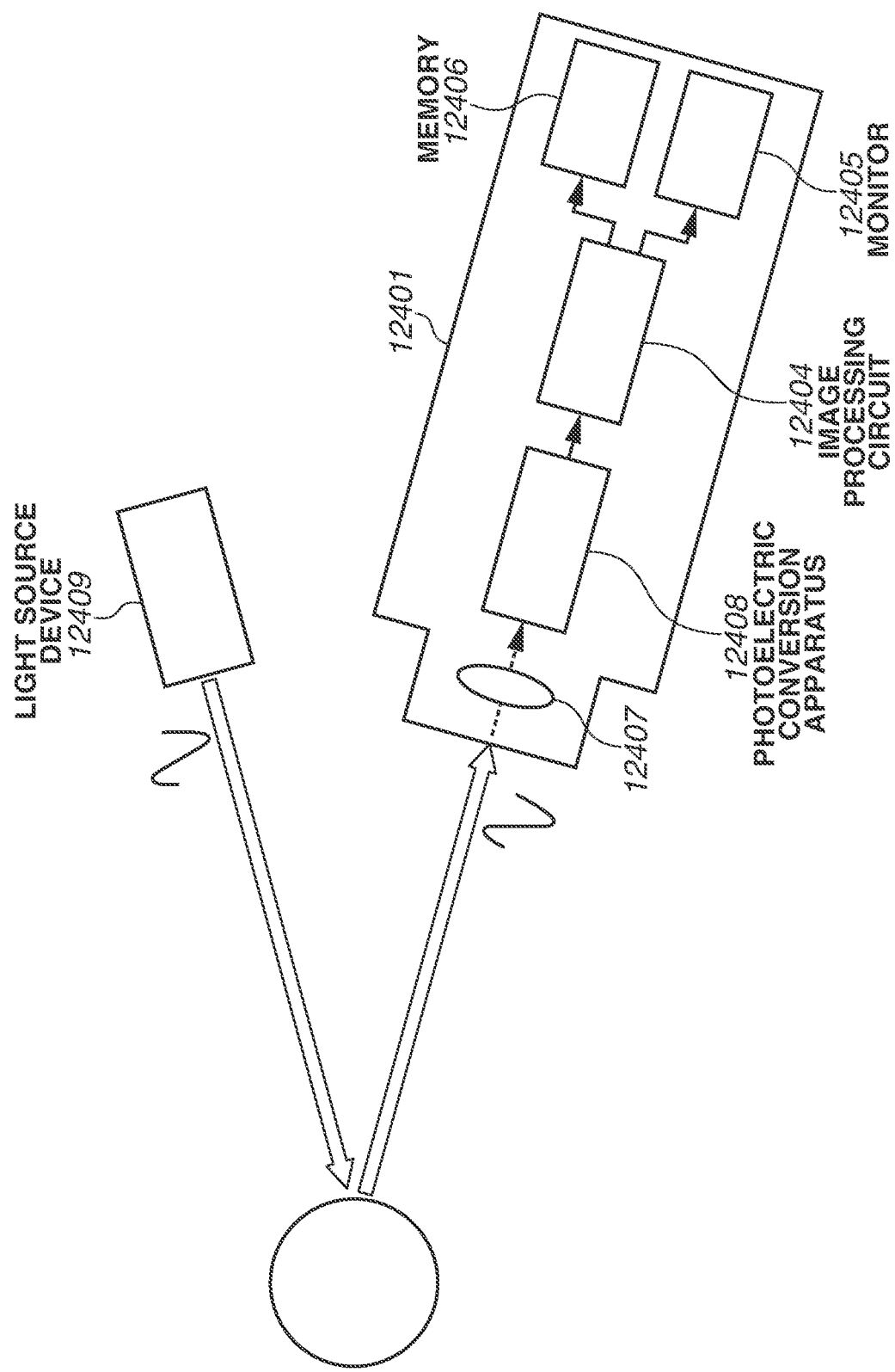
FIG. 16 is a functional block diagram illustrating a distance sensor.

A ninth embodiment will be described below. FIG. 16 is a block diagram illustrating an example of a configuration of a distance image sensor that is an electron device using one of the photoelectric conversion apparatuses according to the above-described embodiments.

As illustrated in FIG. 16, a distance image sensor 12401 includes an optical system 12407, a photoelectric conversion apparatus 12408, an image processing circuit 12404, a monitor 12405, and a memory 12406. The distance image sensor 12401 acquires a distance image based on a distance to a subject by receiving light (modulated light, pulse light) emitted from a light source device 12409 toward the subject and reflected by a surface of the subject.

The optical system 12407 includes a single lens or a plurality of lenses. The optical system 12407 guides image light (incident light) from the subject to the photoelectric conversion apparatus 12408 and forms an image on a light receiving surface (sensor portion) of the photoelectric conversion apparatus 12408.

A photoelectric conversion apparatus according to any one of the above-described embodiments is applied to the photoelectric conversion apparatus 12408, and a distance signal indicating a distance that is obtained based on a received light signal output from the photoelectric conversion apparatus 12408 is fed to the image processing circuit 12404.

The image processing circuit 12404 performs image processing to generate a distance image based on the distance signal fed from the photoelectric conversion apparatus 12408. The distance image (image data) obtained by the image processing is fed to the monitor 12405 and displayed thereon or is fed to the memory 12406 and stored (recorded) therein.

Applying the photoelectric conversion apparatus described above to the distance image sensor 12401 having the foregoing configuration improves pixel characteristics, so that, for example, a more accurate distance image is obtained.

A tenth embodiment will be described below. A technique according to the present disclosure (present technique) is applicable to various products. For example, the technique according to the present disclosure is applicable to an endoscopic surgery system.

Figure 17:
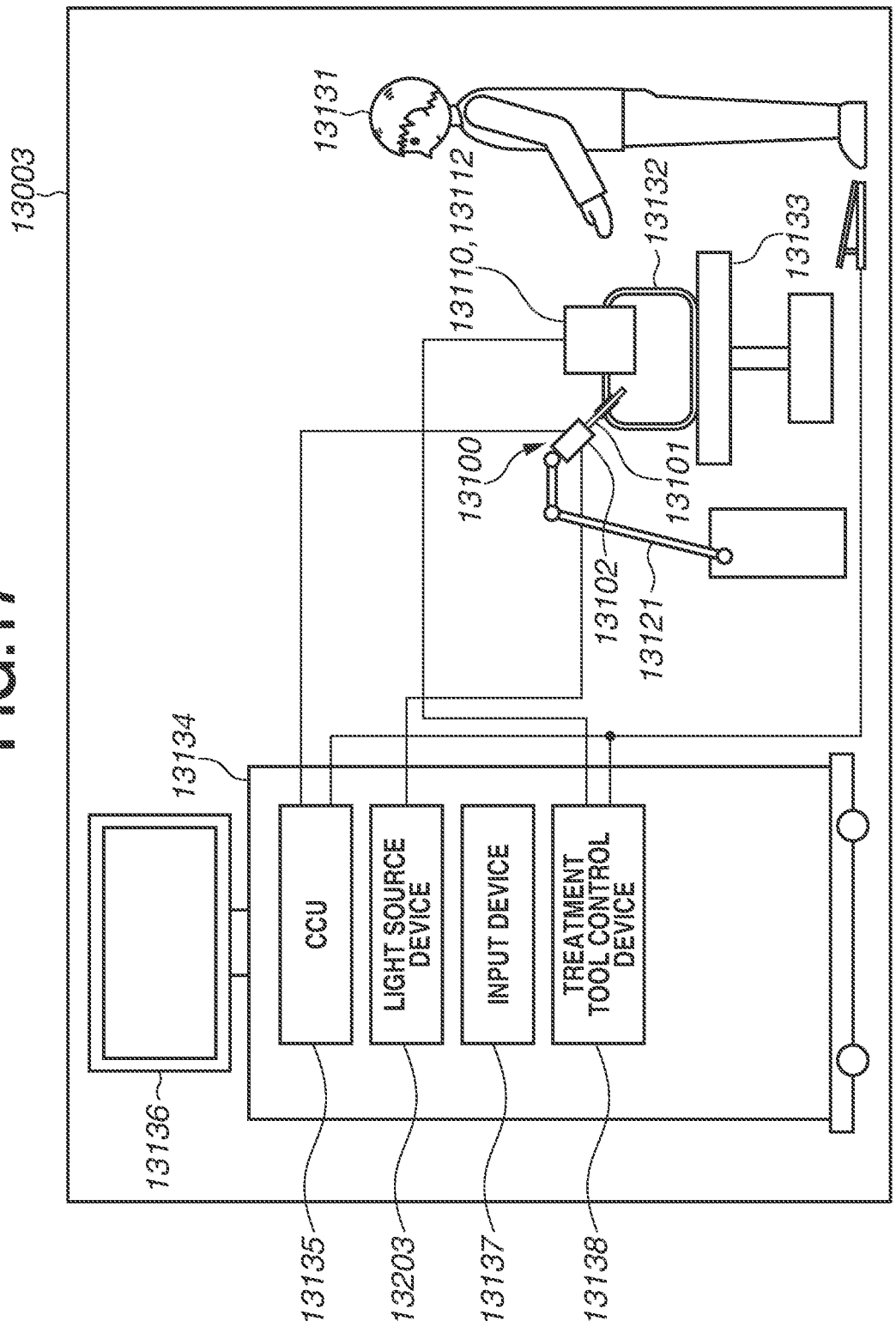
FIG. 17 is a functional block diagram illustrating an endoscopic surgery system.

FIG. 17 is a diagram illustrating an example of a schematic configuration of an endoscopic surgery system to which the technique according to the present disclosure (present technique) is applicable.

FIG. 17 illustrates an operator (doctor) 13131 performing an operation on a patient 13132 on a patient bed 13133 using an endoscopic surgery system 13003. As illustrated in FIG. 17, the endoscopic surgery system 13003 includes an endoscope 13100, a surgical instrument 13110, and a cart 13134 on which various devices for the endoscopic operation are placed.

The endoscope 13100 includes a lens barrel 13101 and a camera head 13102. A region of the lens barrel 13101 up to a predetermined length from a tip end of the lens barrel 13101 is inserted into a body cavity of the patient 13132. The camera head 13102 is connected to a base end of the lens barrel 13101. While the endoscope 13100 as a rigid endoscope including the rigid lens barrel 13101 is illustrated as an example, the endoscope 13100 can be a flexible endoscope including a flexible lens barrel.

The tip end of the lens barrel 13101 includes an opening in which an objective lens is fitted. A light source device 13203 is connected to the endoscope 13100, and light generated by the light source device 13203 is guided to the tip end of the lens barrel 13101 by a light guide extended in the lens barrel 13101. The light is directed toward an observation target in the body cavity of the patient 13132 through the objective lens to illuminate the observation target. The endoscope 13100 can be a forward-viewing endoscope, a forward-oblique viewing endoscope or a side-viewing endoscope.

The camera head 13102 includes an optical system and a photoelectric conversion apparatus therein, and reflection light (observation light) from the observation target is condensed to the photoelectric conversion apparatus by the optical system. The photoelectric conversion apparatus photoelectrically converts the observation light and generates an electric signal corresponding to the observation light, i.e., an image signal corresponding to the observation image. Any one of the photoelectric conversion apparatuses according to the above-described embodiments can be used as the photoelectric conversion apparatus. The image signal is transmitted as raw data to a camera control unit (CCU) 13135.

The CCU 13135 includes a central processing unit (CPU) and/or a graphics processing unit (GPU) and comprehensively controls operations of the endoscope 13100 and a display device 13136. Furthermore, the CCU 13135 receives the image signal from the camera head 13102 and performs various types of image processing such as development processing (demosaicing processing) on the image signal to display an image based on the image signal.

The display device 13136 displays an image based on the image signal on which the CCU 13135 has performed image processing, based on the control by the CCU 13135.

The light source device 13203 includes a light source such as a light emitting diode (LED) and supplies illumination light for use in imaging a surgical site to the endoscope 13100.

An input device 13137 is an input interface of the endoscopic surgery system 13003. A user can input various types of information and instructions to the endoscopic surgery system 13003 via the input device 13137.

A treatment tool control device 13138 controls the driving of an energy treatment tool 13112 for cauterization or incision of tissue, or sealing of blood vessels.

The light source device 13203 for feeding illumination light to the endoscope 13100 in imaging a surgical site can include, for example, a white light source including a LED, a laser light source, or a combination thereof. In a case where the white light source includes a combination of red, green and blue (RGB) laser light sources, the output intensity and timing of each color (each wavelength) is controlled with great accuracy, so that the white balance adjustment of a captured image can be performed by the light source device 13203. Further, in this case, laser light beams from the RGB laser light sources illuminate the observation target by time division, and the driving of an image sensor of the camera head 13102 is controlled in synchronization with the illumination timings, whereby images that respectively correspond to RGB are captured by time division. With this method, a color image can be obtained without providing a color filter to the image sensor.

Further, the driving of the light source device 13203 can be controlled to change the output light intensity at predetermined time intervals. The driving of the image sensor of the camera head 13102 is controlled in synchronization with the light intensity change timings to acquire images by time division, and the acquired images are combined together to generate a high dynamic range image without underexposure and overexposure.

Further, the light source device 13203 can be configured to feed light of a predetermined wavelength band for special light observation. In special light observation, for example, the wavelength dependency of light absorption in body tissue is used. Specifically, predetermined tissue, such as blood vessels in a superficial portion of a mucous membrane, is illuminated with light of a narrower band than illumination light (i.e., white light) in normal observation to capture a high-contrast image. Alternatively, in special light observation, fluorescence observation can be performed to obtain an image using fluorescence generated by irradiation with excited light. In fluorescence observation, body tissue is irradiated with excited light to observe fluorescence from the body tissue, or a reagent such as indocyanine green (ICG) is locally injected into the body tissue and the body tissue is irradiated with excited light corresponding to the fluorescence wavelength of the reagent to obtain a fluorescent image. The light source device 13203 can be configured to feed narrow-band light for the special light observation and/or excited light.

Figure 18A:
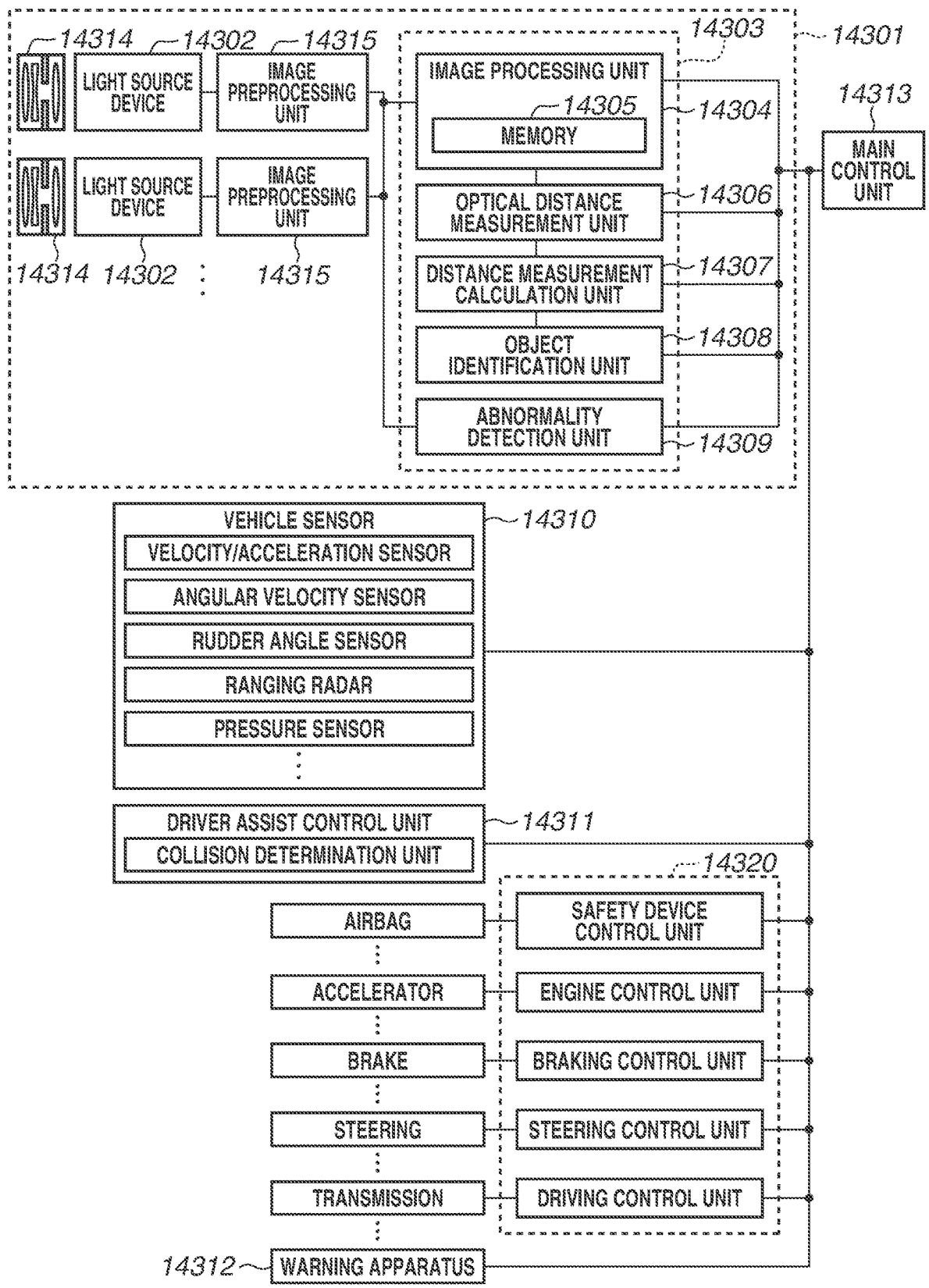
FIG. 18A is a diagram illustrating a photoelectric conversion system.

A photoelectric conversion system and a moving body according to an eleventh embodiment will be described below with reference to FIGS. 18A and 18B. FIGS. 18A and 18B are schematic views illustrating an example of a configuration of the photoelectric conversion system and the moving body according to the present embodiment. An example of an on-vehicle camera as a photoelectric conversion system according to the present embodiment will be described below.

FIGS. 18A and 18B illustrate an example of a vehicle system and a photoelectric conversion system included therein and configured to perform imaging. A photoelectric conversion system 14301 includes photoelectric conversion apparatuses 14302, image preprocessing units 14315, an integrated circuit 14303, and optical systems 14314. Each optical system 14314 forms an optical image of a subject on the corresponding photoelectric conversion apparatus 14302. The photoelectric conversion apparatus 14302 converts the optical image of the subject formed by the optical system 14314 into an electric signal. The photoelectric conversion apparatus 14302 is a photoelectric conversion apparatus according to one of the above-described embodiments. The image preprocessing unit 14315 performs predetermined signal processing on signals output from the photoelectric conversion apparatus 14302. The function of the image preprocessing unit 14315 can be included in the photoelectric conversion apparatus 14302. The photoelectric conversion system 14301 includes at least two sets of the optical system 14314, the photoelectric conversion apparatus 14302, and the image preprocessing unit 14315, and the output from the image preprocessing unit 14315 of each set is input to the integrated circuit 14303.

The integrated circuit 14303 is an integrated circuit for use in an imaging system. The integrated circuit 14303 includes an image processing unit 14304 including a memory 14305 therein, an optical distance measurement unit 14306, a distance measurement calculation unit 14307, an object identification unit 14308, and an abnormality detection unit 14309. The image processing unit 14304 performs image processing such as development processing and defect correction on an output signal from the image preprocessing unit 14315. The memory 14305 primarily stores a captured image and also stores the position of a defect in imaging pixels. The optical distance measurement unit 14306 performs focusing on a subject and distance measurement. The distance measurement calculation unit 14307 calculates range information based on a plurality of pieces of image data acquired by the plurality of photoelectric conversion apparatuses 14302. The object identification unit 14308 identifies a subject such as a vehicle, a road, a traffic sign, or a person. In a case where the abnormality detection unit 14309 detects an abnormality in the photoelectric conversion apparatus 14302, the abnormality detection unit 14309 notifies a main control unit 14313 of the abnormality.

The integrated circuit 14303 can be realized by dedicated hardware, a software module, or a combination thereof. Further, the integrated circuit 14303 can be realized by a field-programmable gate array (FPGA), an application-specific integrated circuit (ASIC), or a combination thereof.

The main control unit 14313 comprehensively controls operations of the photoelectric conversion system 14301, a vehicle sensor 14310, and a control unit 14320. Alternatively, a method can be employed in which the main control unit 14313 is not included and the photoelectric conversion system 14301, the vehicle sensor 14310, and the control unit 14320 each include a communication interface to transmit and receive control signals to and from one another via a communication network (e.g., controller area network (CAN) standard).

The integrated circuit 14303 has a function of transmitting a control signal or a setting value to the photoelectric conversion apparatus 14302 based on a control signal received from the main control unit 14313 or a control unit of the integrated circuit 14303.

The photoelectric conversion system 14301 is connected to the vehicle sensor 14310 and detects a driving state of the vehicle, such as a vehicle speed, yaw rate, and rudder angle, the external environment of the vehicle, and states of other vehicles and obstacles. The vehicle sensor 14310 is also a distance information acquisition unit that acquires distance information about a distance to a target object. Further, the photoelectric conversion system 14301 is connected to a driver assist control unit 14311. The driver assist control unit 14311 performs various types of driver assistance such as automatic steering, automatic cruising, and collision prevention function. Especially in the collision determination function, a possibility or a presence/absence of a collision with another vehicle or an obstacle is estimated based on detection results of the photoelectric conversion system 14301 and the vehicle sensor 14310. With this collision determination function, control is performed to avoid a collision in a case where a collision is estimated, or a safety device is activated in a case where a collision has occurred.

Further, the photoelectric conversion system 14301 is also connected to a warning apparatus 14312. The warning apparatus 14312 issues a warning to a driver based on a determination result of the collision determination unit. For example, in a case where the collision determination unit determines that there is a high possibility of a collision, the main control unit 14313 performs vehicle control to avoid a collision or reduce damage by applying a brake, releasing an accelerator, or reducing engine output.

The warning apparatus 14312 issues a warning to a user by producing an alarm such as a sound, displaying warning information on a display unit screen of a car navigation system or a meter panel, or vibrating a seat belt or steering.

According to the present embodiment, the photoelectric conversion system 14301 captures images of an area near the vehicle, such as the front or rear of the vehicle. FIG. 18B illustrates an example of an arrangement of the photoelectric conversion system 14301 in a case where the photoelectric conversion system 14301 captures images of the front of the vehicle.

The two photoelectric conversion apparatuses 14302 are arranged on the front of a vehicle 14300. Specifically, a central line with respect to a movement direction or outer shape (e.g., vehicle width) of the vehicle 14300 is defined as a symmetry axis, and the two photoelectric conversion apparatuses 14302 are arranged symmetrically with respect to the symmetry axis. This form is desirable in acquiring distance information about the distance between the vehicle 14300 and a target subject and in determining the possibility of a collision.

Further, the photoelectric conversion apparatuses 14302 are desirably arranged to not obstruct the field of view of a driver in visually checking the circumstances outside the vehicle 14300. The warning apparatus 14312 is desirably arranged at a position within the driver's field of view.

Further, while an example where a control is performed to avoid a collision with another vehicle is described above in the present embodiment, the present embodiment can be also applied to the control to drive the vehicle automatically following another vehicle and the control to drive the vehicle automatically not to drift from the lane. Further, the photoelectric conversion system 14301 is applicable to not only a vehicle such as an automobile but also any moving bodies (moving apparatuses) such as ships, aircrafts, or industrial robots. Furthermore, in addition to moving bodies, the photoelectric conversion system 14301 is also applicable to devices that widely use object identification, such as an intelligent transport system (ITS).

The photoelectric conversion apparatus according to the present embodiment can further be configured to acquire various types of information such as distance information.

Figure 19A:
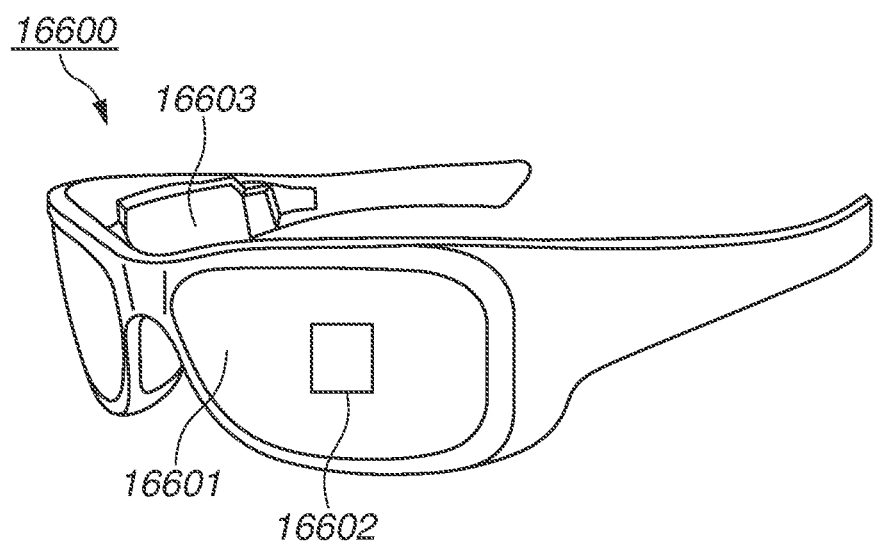
FIGS. 19A and 19B are schematic views illustrating smart glasses.
Figure 19B:
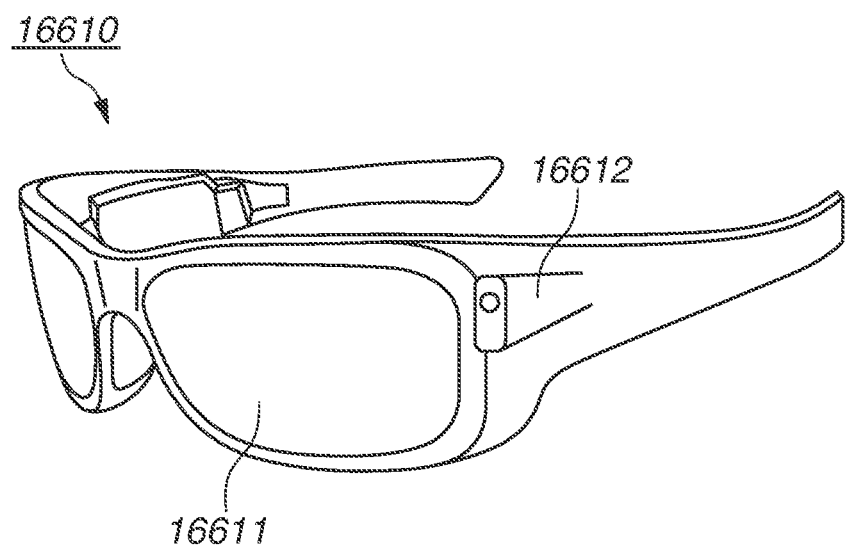

A twelfth embodiment will be described below. FIGS. 19A and 19B illustrates glasses (smart glasses) 16600 according to an application example. The glasses 16600 include a photoelectric conversion apparatus 16602. The photoelectric conversion apparatus 16602 is a photoelectric conversion apparatus according to one of the above-described embodiments. Further, a display device including a light emitting device such as an organic LED or a LED can be provided on a rear surface side of a lens 16601. A single photoelectric conversion apparatus 16602 or a plurality of photoelectric conversion apparatuses 16602 may be provided in the glasses 16600. Further, a plurality of types of photoelectric conversion apparatuses can be used in combination. The location of the photoelectric conversion apparatus 16602 is not limited to that in FIG. 19A.

The glasses 16600 further include a control device 16603. The control device 16603 functions as a power source that supplies power to the photoelectric conversion apparatus 16602 and the display device. Further, the control device 16603 controls operations of the photoelectric conversion apparatus 16602 and the display device. The lens 16601 forms an optical system for condensing light to the photoelectric conversion apparatus 16602.

FIG. 19B illustrates glasses (smart glasses) 16610 according to another application example.

The glasses 16610 include a control device 16612, and the control device 16612 includes a photoelectric conversion apparatus corresponding to the photoelectric conversion apparatus 16602 and the display device. A lens 16611 forms an optical system for projecting light emitted from the photoelectric conversion apparatus and the display device in the control device 16612, and an image is projected to the lens 16611. The control device 16612 functions as a power source that supplies power to the photoelectric conversion apparatus and the display device. The control device 16612 also controls operations of the photoelectric conversion apparatus and the display device. The control device 16612 can also include a line-of-sight detection unit that detects the line of sight of the wearer. Infrared light can be used in the line-of-sight detection. An infrared light emitting unit emits infrared light to the eyeballs of a user gazing at a displayed image. The infrared light emitted by the infrared light emitting unit and thereafter reflected from the eyeballs is detected by an imaging unit including a light receiving element to obtain a captured image of the eyeballs. The inclusion of a reducing unit that reduces light from the infrared light emitting unit to the display unit in a plan view prevents a decrease in image quality.

The line of sight of the user with respect to the displayed image is detected from the captured image of the eyeballs that is acquired by infrared imaging. A publicly-known method is applicable to the line-of-sight detection using a captured eyeball image. For example, a line-of-sight detection method based on a Purkinje image of reflections of irradiation light at the cornea can be used.

More specifically, line-of-sight detection processing based on the pupil center cornea reflection method is performed. A line-of-sight vector indicating an eyeball orientation (rotation angle) is calculated based on an image of a pupil center included in the captured eyeball image and the Purkinje image using the pupil center cornea reflection method to detect the line of sight of the user.

The display device according to the present embodiment includes the photoelectric conversion apparatus including the light receiving element and controls an image displayed on the display device based on the line-of-sight information about the user from the photoelectric conversion apparatus.

Specifically, a first field-of-view region and a second field-of-view region of the display device are determined based on the line-of-sight information. The first field-of-view region is a region at which the user is gazing, and the second field-of-view region is a region other than the first field-of-view region. The first field-of-view region and the second field-of-view region can be determined by a control device of the display device, or the first field-of-view region and the second field-of-view region that are determined by an external control device can be received. In the display region of the display device, the display resolution of the first field-of-view region can be controlled to be higher than the display resolution of the second field-of-view region. Specifically, the resolution of the second field-of-view region can be set lower than the resolution of the first field-of-view region.

Further, the display region includes a first display region and a second display region different from the first display region, and a high-priority region can be determined from the first display region and the second display region based on the line-of-sight information. The first field-of-view region and the second field-of-view region can be determined by the control device of the display device, or the first field-of-view region and the second field-of-view region that are determined by an external control device can be received. The resolution of the high-priority region can be controlled to be higher than the resolution of the region other than the high-priority region. In other words, the resolution of the region that is relatively lower in priority can be set low.

AI can be used in determining the first field-of-view region or the high-priority region. AI can be a model trained to estimate an angle of a line of sight from an image of eyeballs and a distance to a target object in the extension of the line of sight using the image of the eyeballs and a viewing direction of the eyeballs of the image as training data. An AI program can be stored in the display device, the photoelectric conversion apparatus, or an external apparatus. In a case where an external apparatus stores the AI program, the AI program is transmitted to the display device via communication.

In a case where display control is performed based on visual recognition and detection, the present embodiment is suitably applicable to smart glasses further including a photoelectric conversion apparatus configured to capture external images. Smart glasses are capable of displaying captured external information in real time.

A system according to a thirteenth embodiment will be described below with reference to FIG. 20. The present embodiment is applicable to a pathological diagnosis system with which a doctor diagnoses a lesion by observing cells and tissues obtained from a patient and a diagnosis assistance system assisting the pathological diagnosis system. The system according to the present embodiment can be used to diagnose a lesion based on an acquired image or can assist with the diagnosis.

Figure 20:
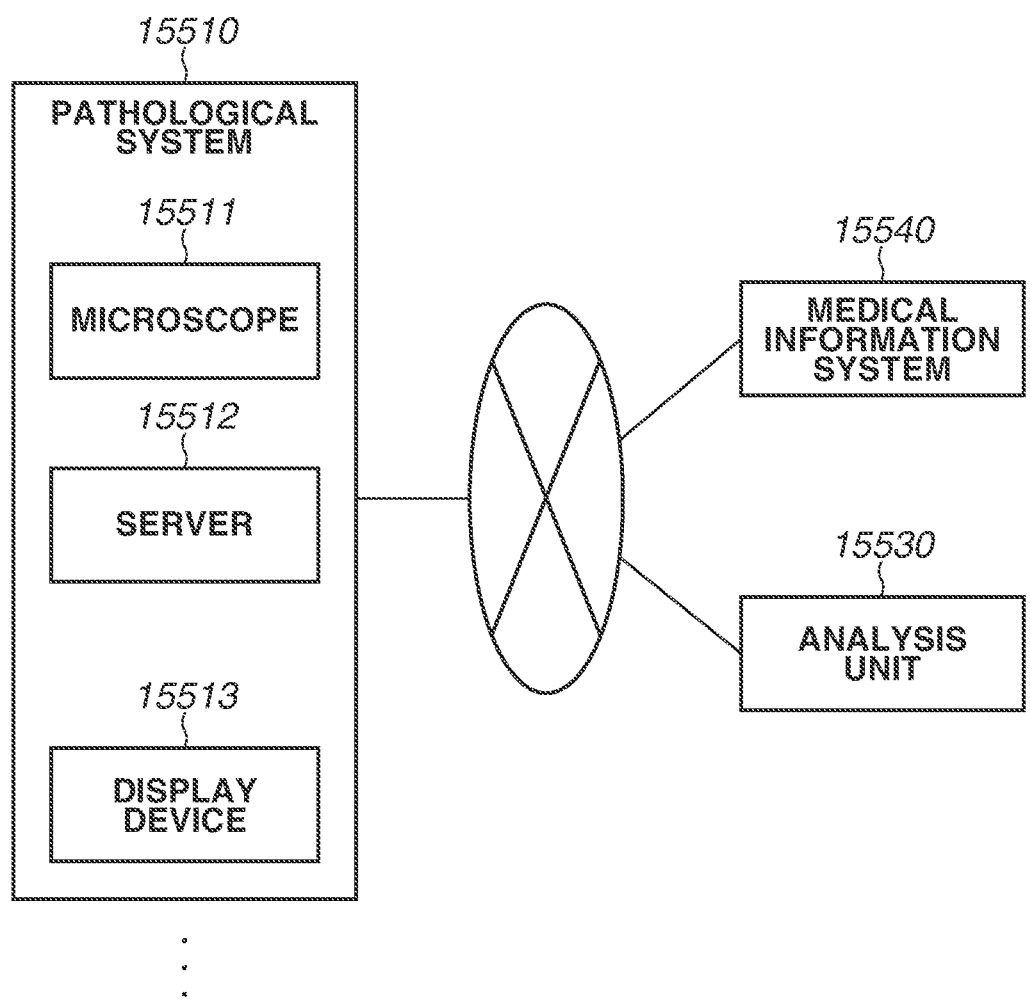
FIG. 20 is a functional block diagram illustrating a diagnosis system.

As illustrated in FIG. 20, the system according to the present embodiment includes one or more pathological systems 15510. The system can further include an analysis unit 15530 and a medical information system 15540.

Each of the one or more pathological systems 15510 is a system that is used mainly by a pathologist and is installed in, for example, laboratories and hospitals. The pathological systems 15510 can be installed in different hospitals from one another and are each connected to the analysis unit 15530 and the medical information system 15540 via various networks such as a wide area network and a local area network.

The pathological systems 15510 each include a microscope 15511, a server 15512, and a display device 15513.

The microscope 15511 has an optical microscope function and captures an image of an observation target placed on a glass slide to obtain a pathological image as a digital image. The observation target can be, for example, a tissue or cell obtained from a patient, such as a piece of an organ, saliva, or blood.

The server 15512 stores the pathological image obtained by the microscope 15511 in a storage unit (not illustrated). Further, in a case where a browsing request is received, the server 15512 searches for a pathological image stored in a memory and displays a detected pathological image on the display device 15513. A display control device can be provided between the server 15512 and the display device 15513.

In a case where an observation target is a solid object such as a piece of an organ, the observation target can be, for example, a stained thin slice of the solid object. The thin slice can be prepared by, for example, slicing a block cut from a specimen such as an organ. Further, in slicing a block, the block can be fixed with paraffin.

The microscope 15511 can include a low-resolution imaging unit for imaging at low resolution and a high-resolution imaging unit for imaging at high resolution. The low-resolution imaging unit and high-resolution imaging unit can be different optical systems or the same optical system. In a case where the low-resolution imaging unit and high-resolution imaging unit are the same optical system, the resolution of the microscope 15511 can be changed based on an imaging target.

An observation target is placed on a glass slide, and the glass slide with the observation target thereon is placed on a stage situated within an angle of view of the microscope 15511. The microscope 15511 first acquires an entire image within the angle of view using the low-resolution imaging unit and then identifies a region of the observation target from the acquired entire image. Then, the microscope 15511 divides the region where the observation target is into a plurality of regions having a predetermined-size, and the divided regions are sequentially imaged using the high-resolution imaging unit to obtain a high-resolution image of each divided region. To switch a target divided region, the stage, the imaging optical system, or both can be moved. Further, each divided region can include a region overlapping an adjacent divided region in order to prevent any region from being missed in imaging due to unintentional slipping of the glass slide. Further, the entire image can contain identification information for associating the entire image with the patient. The identification information can be, for example, a character string or a Quick Response (QR) Code®.

The high-resolution images obtained by the microscope 15511 are input to the server 15512. The server 15512 can divide each high-resolution image into smaller partial images. After generating the partial images, the server 15512 performs combining processing of combining a predetermined number of adjacent partial images together to generate a single image on all the partial images. This combining processing can be repeated until a single partial image is eventually generated. By this processing, a partial image group having a pyramid structure with each hierarchical layer consisting of one or more partial images is generated. In this pyramid structure, a partial image of a layer and a partial image of another layer are the same in the number of pixels but are different in resolution from each other. For example, in a case where two by two partial images, i.e., four partial images, are combined together to generate a single partial image of an upper layer, the resolution of the partial image of the upper layer is one-half the resolution of the partial images of a lower layer that are used in the combining.

The partial image group having the pyramid structure as described above is formed so that the level of detail of each observation target to be displayed on the display device can be changed based on the hierarchical layer to which the display target tile image belongs. For example, in a case where a partial image of the lowermost layer is used, a narrow region of the observation target is displayed in detail, and in cases where partial images of upper layers are used, wider regions of the observation target are displayed roughly.

The generated partial image group of the pyramid structure can be stored in, for example, a memory. In a case where an acquisition request for acquiring a partial image containing identification information is received from another apparatus (e.g., the analysis unit 15530), the server 15512 transmits a partial image corresponding to the identification information to the other apparatus.

A partial image as a pathological image can be generated for each imaging condition such as a focal length and staining condition. In a case where a partial image is generated for each imaging condition, a specific pathological image and another pathological image that corresponds to an imaging condition different from a specific imaging condition and is of the same region as the specific pathological image can be displayed next to each other. The specific imaging condition can be designated by a viewer. In a case where the viewer designates a plurality of imaging conditions, pathological images that correspond to the imaging conditions and are of the same region can be displayed next to each other.

Further, the server 15512 can store the partial image group having the pyramid structure in a storage apparatus other than the server 15512, such as a cloud server. Further, the partial image generation processing described above can partially or entirely be performed by the cloud server. Use of the partial images as described above enables a user to feel as though the user is observing an observation target while changing an observation magnification. In other words, the display control described above can play a role similar to a virtual microscope. A virtual observation magnification herein corresponds to a resolution.

The medical information system 15540 can be referred to as an electronic health record system and stores patient identification information, patient disease information, inspection information and image information used in diagnosis, diagnosis result, and diagnosis-related information such as prescription medication. For example, a pathological image obtained by imaging an observation target of a patient is first stored via the server 15512 and thereafter displayed on the display device 15513. A pathologist using the pathological system 15510 performs pathological diagnosis based on the pathological image displayed on the display device 15513. A result of the pathological diagnosis performed by the pathologist is stored in the medical information system 15540.

The analysis unit 15530 can analyze the pathological image. In the analysis, a trained model generated by machine learning can be used. The analysis unit 15530 can derive a result of classification of a specific region or a tissue identification result as an analysis result. Furthermore, the analysis unit 15530 can derive an identification result, such as cell information, quantity, position, and luminance information, and scoring information thereon. The information obtained by the analysis unit 15530 can be displayed as diagnosis assistance information on the display device 15513 of the pathological system 15510.

The analysis unit 15530 can be a server system consisting of one or more servers (including a cloud server). Further, the analysis unit 15530 can be embedded in, for example, the server 15512 in the pathological system 15510. Specifically, various types of analysis of the pathological images can be performed in the pathological system 15510.

The photoelectric conversion apparatuses according to the above-described embodiments are suitably applicable to, for example, the microscope 15511 among those configurations described above. Specifically, the photoelectric conversion apparatuses according to the above-described embodiments are applicable to the low-resolution imaging unit and/or the high-resolution imaging unit in the microscope 15511. This makes it possible to reduce the size of the low-resolution imaging unit and/or the high-resolution imaging unit to reduce the size of the microscope 15511. This makes it easy to transport the microscope 15511, so that system introduction and system rearrangement are facilitated. Furthermore, an application of a photoelectric conversion apparatus according to any of the above-described embodiments makes it possible to perform a series of processes from the pathological image acquisition to the pathological image analysis partially or entirely on the fly in the microscope 15511. This makes it possible to output diagnosis assistance information more promptly and accurately.

The above-described configurations are applicable not only to diagnosis assistance systems but also to biological microscopes such as confocal microscopes, fluorescent microscopes, and video microscopes. The observation target can be biological samples such as cultured cells, fertilized eggs, or sperms, biomaterials such as cell sheets or three-dimensional cell tissues, or living organisms such as zebrafish or mouse. Further, the observation target can be observed not only on a glass slide but also on a well plate or a petri dish.

Further, a moving image can be generated from still images of an observation target that are obtained using a microscope. For example, a moving image can be generated from still images captured consecutively during a predetermined period, or an image sequence can be generated from still images captured at predetermined time intervals. With a moving image generated from still images as described above, a dynamic feature of an observation target, such as a movement such as a pulsation, elongation, or migration of a cancer cell, nerve cell, cardiac muscle tissue, or sperm, or a division process of cultured cells or fertilized eggs can be analyzed using machine learning.

Other Embodiments

While various embodiments are described above, the present invention is not limited to the embodiments, and various changes and modifications are possible. Further, the embodiments are applicable to one another. Specifically, part of an embodiment can be replaced with part of another embodiment, or part of an embodiment can be added to part of another embodiment. Further, part of an embodiment can be deleted.

The scope of the disclosure of the present specification is not limited to what is described in the present specification but encompasses all matters that can be understood from the present specification and the drawings attached to the present specification. Further, the scope of the disclosure of the present specification encompasses complementary sets of concepts disclosed in the present specification. Specifically, for example, in a case where the present specification includes the phrase "A is greater than B" but does not include the phrase "A is not greater than B", it is understood that the present specification discloses the case where "A is not greater than B" because the inclusion of the phrase "A is greater than B" is based on the assumption that the case where "A is not greater than B" is considered.

Dispersion of heat generated in a second substrate and an increased speed of processing involving machine learning performed in the second substrate are realized.

While the present invention has been described with reference to embodiments, it is to be understood that the invention is not limited to the disclosed embodiments, but is defined by the scope of the following claims.

This application claims the benefit of Japanese Patent Application No. 2021-016446, filed Feb. 4, 2021, which is hereby incorporated by reference herein in its entirety.

What is claimed is:

1. A photoelectric conversion apparatus comprising:
    a first substrate including a pixel array including a plurality of pixels, the pixel array including a light shielded region including a plurality of light shielded pixels;
    a second substrate layered on the first substrate and including an analog to digital (AD) conversion portion including a plurality of sets of AD conversion circuits configured to convert a signal output from the first substrate into a digital signal,
    wherein the second substrate further includes a plurality of signal processing units including a first signal processing unit configured to perform machine learning processing and a second signal processing unit configured to perform machine learning processing,
    wherein a plurality of AD conversion circuits of a set of the plurality of sets is different from a plurality of AD conversion circuits of another set of the plurality of sets,
    wherein the first signal processing unit is arranged to correspond to one of the plurality of sets,
    wherein the second signal processing unit is arranged to correspond to another one of the plurality of sets, and
    wherein on a plan view from the pixel array to the second substrate, the first signal processing unit and the second signal processing unit are arranged in positions which do not overlap the light shielded region.

2. The photoelectric conversion apparatus according to claim 1,
    wherein the plurality of sets is arranged in a plurality of rows and a plurality of columns, and
    wherein the plurality of sets is between the first and the second signal processing units.

3. The photoelectric conversion apparatus according to claim 1,
    wherein the plurality of signal processing units further includes a third signal processing unit and a fourth signal processing unit, and
    wherein the AD conversion portion is provided in a region surrounded by the first, the second, the third, and the fourth signal processing units.

4. The photoelectric conversion apparatus according to claim 2, wherein the plurality of signal processing units further includes a third signal processing unit and a fourth signal processing unit, and wherein the AD conversion portion is provided in a region surrounded by the first, the second, the third, and the fourth signal processing units.

5. The photoelectric conversion apparatus according to claim 3, wherein the first, the second, the third, and the fourth signal processing units are arranged along an outer periphery of the second substrate.

6. The photoelectric conversion apparatus according to claim 4, wherein the first, the second, the third, and the fourth signal processing units are arranged along an outer periphery of the second substrate.

7. The photoelectric conversion apparatus according to claim 5, wherein a plurality of pads to which a signal from a source outside the photoelectric conversion apparatus is input or from which a signal is output to a destination outside the photoelectric conversion apparatus is arranged along the outer periphery of the second substrate, and wherein two or more of the first, the second, the third, and the fourth signal processing units are arranged between the plurality of pads and the AD conversion portion.

8. The photoelectric conversion apparatus according to claim 6, wherein a plurality of pads to which a signal from a source outside the photoelectric conversion apparatus is input or from which a signal is output to a destination outside the photoelectric conversion apparatus is arranged along the outer periphery of the second substrate, and wherein two or more of the first, the second, the third, and the fourth signal processing units are arranged between the plurality of pads and the AD conversion portion.

9. The photoelectric conversion apparatus according to claim 7, wherein all the plurality of signal processing units are arranged between the plurality of pads and the AD conversion portion.

10. The photoelectric conversion apparatus according to claim 8, wherein all the plurality of signal processing units are arranged between the plurality of pads and the AD conversion portion.

11. The photoelectric conversion apparatus according to claim 1, wherein the first and the second signal processing units are different in signal processing speed from each other.

12. The photoelectric conversion apparatus according to claim 2, wherein the first and the second signal processing units are different in signal processing speed from each other.

13. The photoelectric conversion apparatus according to claim 3, wherein the first and the second signal processing units are different in signal processing speed from each other.

14. The photoelectric conversion apparatus according to claim 5, wherein the first and the second signal processing units are different in signal processing speed from each other.

15. The photoelectric conversion apparatus according to claim 7, wherein the first and the second signal processing units are different in signal processing speed from each other.

16. The photoelectric conversion apparatus according to claim 1, wherein each of the plurality of sets includes a preprocessing circuit to which the plurality of AD conversion circuits of the set inputs the digital signal, and wherein each of the plurality of signal processing units includes a plurality of signal processing circuits each configured to perform the machine learning, and a processing result of the preprocessing circuit is input to the plurality of signal processing circuits of the first signal processing unit.

17. The photoelectric conversion apparatus according to claim 2, wherein each of the plurality of sets includes a preprocessing circuit to which the plurality of AD conversion circuits of the set inputs the digital signal, and wherein each of the plurality of signal processing units includes a plurality of signal processing circuits each configured to perform the machine learning, and a processing result of the preprocessing circuit is input to the plurality of signal processing circuits of the first signal processing unit.

18. The photoelectric conversion apparatus according to claim 3, wherein each of the plurality of sets includes a preprocessing circuit to which the plurality of AD conversion circuits of the set inputs the digital signal, and wherein each of the plurality of signal processing units includes a plurality of signal processing circuits each configured to perform the machine learning, and a processing result of the preprocessing circuit is input to the plurality of signal processing circuits of the first signal processing unit.

19. The photoelectric conversion apparatus according to claim 16, wherein a number of the plurality of signal processing circuits of the plurality of signal processing units is greater than a number of the preprocessing circuits provided on the second substrate.

20. A photoelectric conversion system comprising:

a first substrate including a pixel array including a plurality of pixels; and a second substrate layered on the first substrate and including an AD conversion portion configured to convert a signal output from the first substrate into a digital signal, wherein the second substrate includes:

the photoelectric conversion apparatus according to claim 1; and a signal processing unit configured to generate an image using a signal output from the photoelectric conversion apparatus.

21. A moving body including the photoelectric conversion apparatus according to claim 1, the moving body comprising:

a control unit configured to control a movement of the moving body using a signal output from the photoelectric conversion apparatus.

22. The photoelectric conversion apparatus according to claim 1, wherein each of the plurality of signal processing unit is for performing machine learning processing, and wherein on the plan view, none of the plurality of signal processing units overlaps the light shielded region.

23. The photoelectric conversion apparatus according to claim 1, wherein the light shielded region is arranged along two sides of the pixel array.

24. The photoelectric conversion apparatus according to claim 23, wherein the light shielded region is in L shape.

25. The photoelectric conversion apparatus according to claim 1, wherein the light shielded region is arranged along four sides of the pixel array.

\* \* \* \* \*